(12) United States Patent
Yoshikawa et al.

(10) Patent No.: US 9,287,090 B2
(45) Date of Patent: Mar. 15, 2016

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama (JP)

(72) Inventors: Ryoichi Yoshikawa, Kanagawa (JP); Hiroshi Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/556,503

(22) Filed: Dec. 1, 2014

(65) Prior Publication Data

US 2015/0155138 A1    Jun. 4, 2015

(30) Foreign Application Priority Data

Dec. 4, 2013 (JP) .................. 2013-250843

(51) Int. Cl.
| H01J 37/317 | (2006.01) |
| H01J 37/302 | (2006.01) |
| H01J 37/24 | (2006.01) |
| H01J 37/147 | (2006.01) |
| H01J 37/04 | (2006.01) |

(52) U.S. Cl.
CPC .......... *H01J 37/3177* (2013.01); *H01J 37/045* (2013.01); *H01J 37/1471* (2013.01); *H01J 37/243* (2013.01); *H01J 37/3023* (2013.01); *H01J 2237/0437* (2013.01)

(58) Field of Classification Search
CPC ......................... H01J 37/3177; H01J 37/1471
See application file for complete search history.

(56) References Cited

U.S. PATENT DOCUMENTS

| 5,260,579 | A | * | 11/1993 | Yasuda ............... | B82Y 10/00 250/398 |
| 2002/0027198 | A1 | | 3/2002 | Nagata et al. | |
| 2005/0242303 | A1 | * | 11/2005 | Platzgummer ...... | B82Y 10/00 250/492.22 |
| 2012/0256106 | A1 | * | 10/2012 | Kurokawa ........... | B82Y 10/00 250/492.22 |

FOREIGN PATENT DOCUMENTS

| JP | 3394237 | 4/2003 |
| JP | 2006-261342 | 9/2006 |

* cited by examiner

*Primary Examiner* — Robert Kim
*Assistant Examiner* — Eliza Osenbaugh-Stewar
(74) *Attorney, Agent, or Firm* — Oblon, McClelland, Maier & Neustadt, L.L.P.

(57) ABSTRACT

A multi charged particle beam writing apparatus includes a divided shot data generation unit to generate, for each shot of multi beams of charged particle beams, data for plural times of divided shots such that irradiation for one shot of each beam is divided into plural times of divided shots each having a different irradiation time, an individual blanking system to provide blanking control individually for each of multi beams, based on the data for plural times of divided shots, an elastic rate correction value acquisition unit to acquire, for each of plural times of divided shots, an elastic rate correction value for correcting an elastic rate of an image of the whole multi beams, depending upon the number of ON-beams of the multi beams, and a lens to correct, for each divided shot, the elastic rate of the image of the whole multi beams by using the correction value.

11 Claims, 22 Drawing Sheets

| Digit | k | k-1 | k-2 | k-3 | .... |
|---|---|---|---|---|---|
| Beam 1 | 1 | 1 | 0 | 1 | .... |
| Beam 2 | 1 | 1 | 0 | 0 | .... |
| Beam 3 | 0 | 1 | 1 | 0 | .... |
| Beam 4 | 0 | 1 | 1 | 1 | .... |
| Beam 5 | 1 | 0 | 1 | 1 | .... |
| ⋮ | | | | | |

FIG. 7

MULTI CHARGED PARTICLE BEAM WRITING APPARATUS, AND MULTI CHARGED PARTICLE BEAM WRITING METHOD

CROSS-REFERENCE TO RELATED APPLICATION

This application is based upon and claims the benefit of priority from the prior Japanese Patent Application No. 2013-250843 filed on Dec. 4, 2013 in Japan, the entire contents of which are incorporated herein by reference.

BACKGROUND OF THE INVENTION

1. Field of the Invention

The present invention relates to a multi charged particle beam writing apparatus and a multi charged particle beam writing method. More specifically, for example, the present invention relates to correcting the space charge effect in multi beam writing.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi beams) can be cited. Compared with the case of writing a pattern by using a single electron beam, since it is possible to emit multiple beams at a time in multi-beam writing, the throughput can be greatly increased. For example, in a writing apparatus employing a multi-beam system, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Published Unexamined Patent Application (JP-A) No. 2006-261342).

In the multi-beam writing, when performing highly precise writing, the dose of each beam is individually controlled based on an irradiation time in order to give a specified dose onto each position on a target object. With respect to each shot, since the irradiation time of each beam is not constant, even if 10000 beams are emitted at a certain time in one shot, only 1 ns (nanosecond) later, for example, the number of ON beams becomes 500, and further 1 ns later, the number of ON beams becomes 50, for example. Thus, since the number of ON beams of multi beams changes every moment, the ON-beam pattern and the beam current in the multi beams change dynamically in one shot. Therefore, in a charged particle beam, such as an electron beam, repulsion occurs, on the beam path, among particles having electric charge and thereby the beam path changes. The effect of this causes a space charge effect that becomes large in proportion to the beam current (the number of particles). Consequently, there is a problem that a focus deviation, a position deviation of a writing pattern and the like are generated due to the space charge effect during irradiation of each beam in one shot.

However, it is difficult to perform correction of a focus deviation, a position deviation of a writing pattern and the like such that the correction follows an ON-beam pattern and a beam current that change dynamically during irradiation of each beam in one shot.

BRIEF SUMMARY OF THE INVENTION

According to one aspect of the present invention, a multi charged particle beam writing apparatus includes a divided shot data generation unit configured to generate, for each shot of multi beams of charged particle beams, data for a plurality of times of divided shots such that irradiation for one shot of each beam is divided into the plurality of times of divided shots each having a different irradiation time, an individual blanking system configured to provide blanking control individually for the each beam of the multi beams, based on the data for the plurality of times of divided shots, an elastic rate correction value acquisition unit configured to acquire, for each divided shot of the plurality of times of divided shots, an elastic rate correction value for correcting an elastic rate of an image of a whole of the multi beams, depending upon a number of ON beams of the multi beams, and a lens configured to correct, for the each divided shot, the elastic rate of the image of the whole of the multi beams by using the elastic rate correction value.

According to another aspect of the present invention, a multi charged particle beam writing method includes dividing, for each shot of multi beams of charged particle beams, irradiation for one shot of each beam of the multi beams into a plurality of times of divided shots each having a different irradiation time, and irradiating, in order, a beam of an irradiation time corresponding to each of the plurality of times of divided shots onto a target object, and correcting, for the each of the plurality of times of divided shots, an elastic rate of an image of a whole of the multi beams, depending upon a number of ON beams of the multi beams.

BRIEF DESCRIPTION OF THE DRAWINGS

FIG. 7 shows an example of a part of irradiation time arrangement data according to the first embodiment;

DETAILED DESCRIPTION OF THE INVENTION

In the following embodiments, there will be described a writing apparatus and method that can correct a position deviation of a writing pattern, which is generated by a space charge effect, in multi-beam writing.

Furthermore, in the following embodiments, there will be described a configuration in which an electron beam is used as an example of a charged particle beam. The charged particle beam is not limited to the electron beam, and other charged particle beam such as an ion beam may also be used.

First Embodiment

Figure 1:
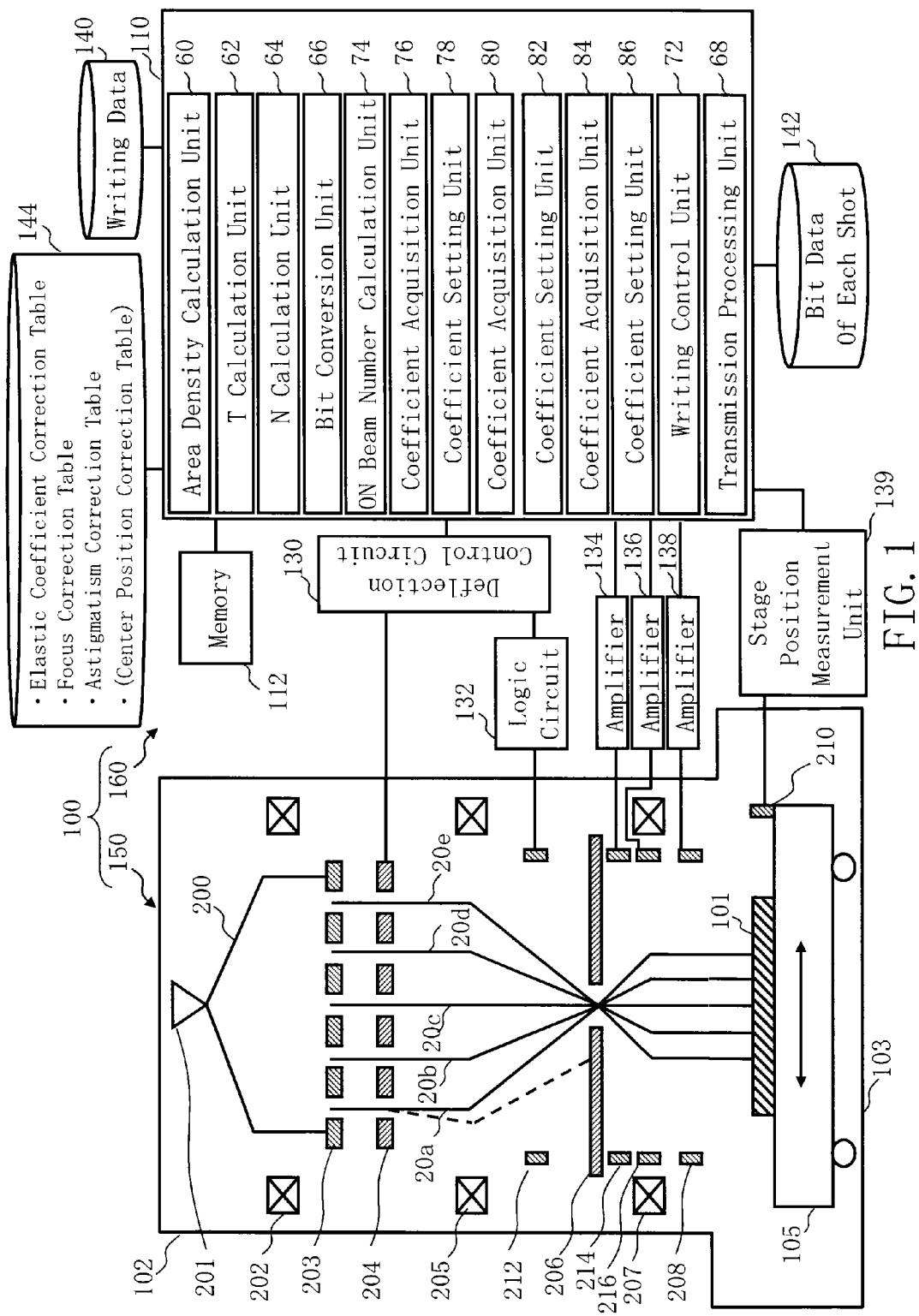
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a deflector 212, a limiting aperture member 206, an objective lens 207, a deflector 208 and electrostatic lenses 214 and 216. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or is a semiconductor substrate (silicon wafer) on which semiconductor elements are formed. The target object 101 may be, for example, a mask blank on which resist is applied and a pattern has not yet been formed. On the XY stage 105, further, there is arranged a mirror 210 for measuring the position of the XY stage 105.

Both the reducing lens 205 and the objective lens 207 are electromagnetic lenses, and the reduction optical system is configured by the reducing lens 205 and the objective lens 207. The electrostatic lenses 214 and 216 are arranged in the magnetic field of the objective lens 207. It is preferable that the electrostatic lenses 214 and 216 are arranged at the positions in the magnetic field of the objective lens 207 so that the effect of voltages applied to the electrostatic lenses 214 and 216 themselves respectively may act efficiently with the magnetic field of the objective lens 207. However, it is not limited thereto. For example, it is also preferable that one of the electrostatic lenses 214 and 216 is arranged in the magnetic field of reducing lens 205 and the other of them is arranged in the magnetic field of the objective lens 207. Alternatively, the electrostatic lenses 214 and 216 may be arranged in the magnetic field of reducing lens 205. It is preferable that these configurations may be suitably designed to meet the needs.

The control unit 160 includes a control computer 110, a memory 112, a deflection control circuit 130, a logic circuit 132, digital analog converter (DAC) amplifiers 134, 136, and 138, a stage position measurement unit 139, and storage devices 140, 142, and 144 such as magnetic disk drives. The control computer 110, the memory 112, the deflection control circuit 130, the DAC amplifiers 134, 136, and 138, the stage position measurement unit 139, and the storage devices 140, 142, and 144 are connected with each other through a bus (not shown). Each of logic circuits of a plurality of individual blanking systems (not shown) mounted on the blanking plate 204 is directly or indirectly connected to the deflection control circuit 130 by using a shift register, as will be described later. Moreover, the logic circuit 132 is connected to the deflection control circuit 130. The DAC amplifier 134 is connected to the electrostatic lens 214. The DAC amplifier 136 is connected to the electrostatic lens 216. The DAC amplifier 138 is connected to the deflector 208.

Writing data is input from the outside and stored in the storage device 140 (storage unit). Moreover, an elastic coefficient correction table, a center position coefficient correction table, and a focus correction table are input from the outside and stored in the storage device 144 (storage unit).

In the control computer 110, there are arranged an area density calculation unit 60, an irradiation time calculation unit 62, a gray level value calculation unit 64, a bit conversion unit 66, an ON beam number calculation unit 74, coefficient acquisition units 76, 80, and 84, coefficient setting units 78, 82, and 86, a writing control unit 72, and a transmission processing unit 68. Functions of them may be configured by hardware such as an electric circuit, or by software such as a program causing a computer to implement these functions. Alternatively, they may be configured by a combination of hardware and software. Data which is input and output to/from the area density calculation unit 60, the irradiation time calculation unit 62, the gray level value calculation unit 64, the bit conversion unit 66, the ON beam number calculation unit 74, the coefficient acquisition units 76, 80, and 84, the coefficient setting units 78, 82, and 86, the writing control unit 72, or the transmission processing unit 68 and data being calculated are stored in the memory 112 each time.

FIG. 1 shows a configuration necessary for explaining the first embodiment. Other configuration elements generally necessary for the writing apparatus 100 may also be included.

Figure 2A:
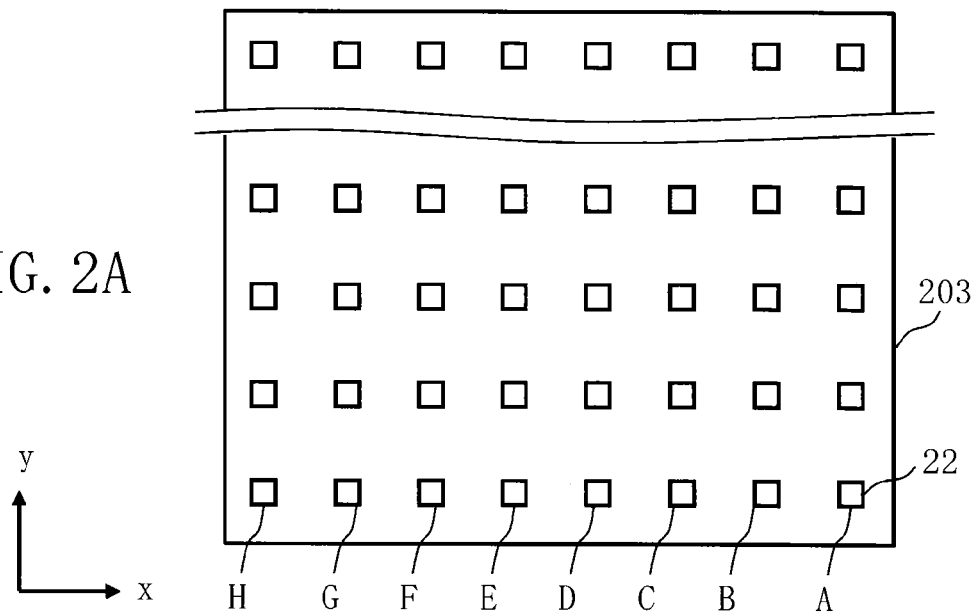
FIGS. 2A and 2B are conceptual diagrams each showing an example of a configuration of an aperture member according to the first embodiment.
Figure 2B:
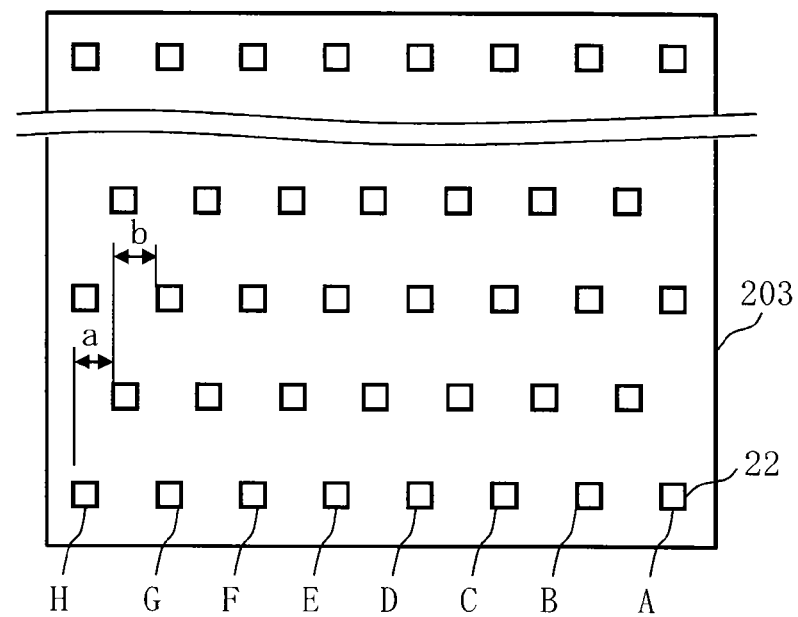

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
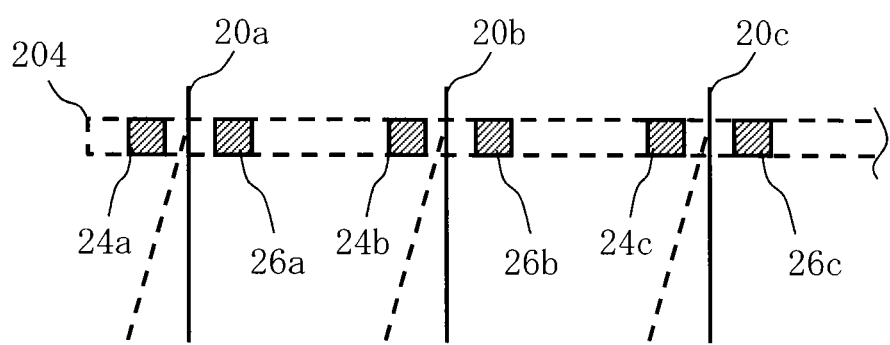
FIG. 3 is a conceptual diagram showing a configuration of a blanking plate according to the first embodiment.
Figure 4:
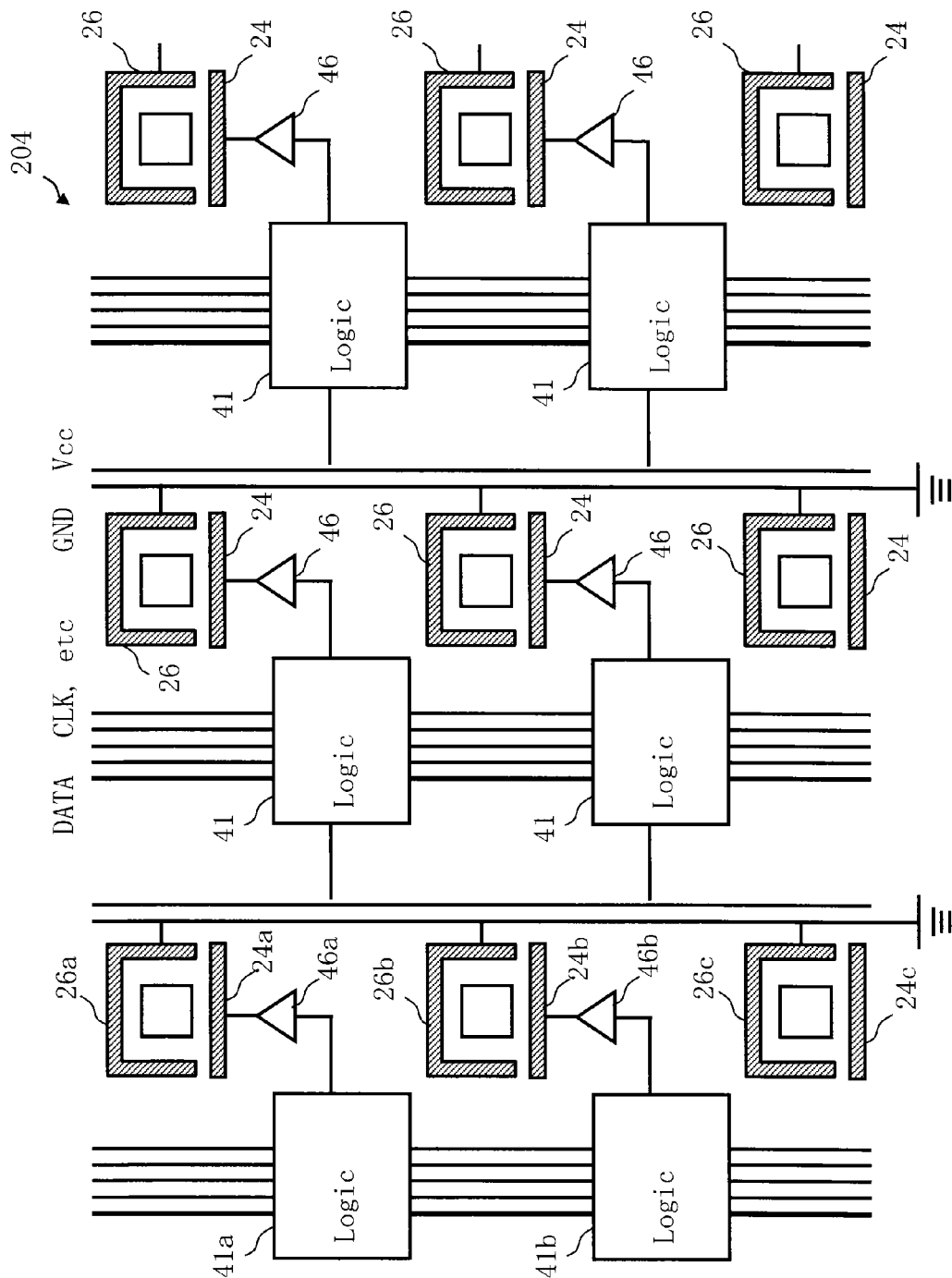
FIG. 4 is a top view conceptual diagram showing a configuration of a blanking plate according to the first embodiment.

FIG. 3 is a conceptual diagram showing the configuration of a blanking plate according to the first embodiment. FIG. 4 is a top view conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: blanking deflector) is arranged for each passage hole. An amplifier 46 for applying voltage is respectively arranged at one (for example, the electrode 24) of the two electrodes 24 and 26 for each beam. A logic circuit 41 is independently arranged at the amplifier 46 for each beam respectively. The other one (for example, the electrode 26) of the two electrodes 24 and 26 for each beam is grounded. An electron beam 20 passing through a corresponding passage hole is respectively deflected by the voltage applied to the two electrodes 24 and 26 being a pair. Blanking control is performed by this deflection. Thus, a plurality of blankers respectively perform blanking deflection of a corresponding beam in the multi beams having passed through a plurality of holes 22 (openings) of the aperture member 203.

Figure 5:
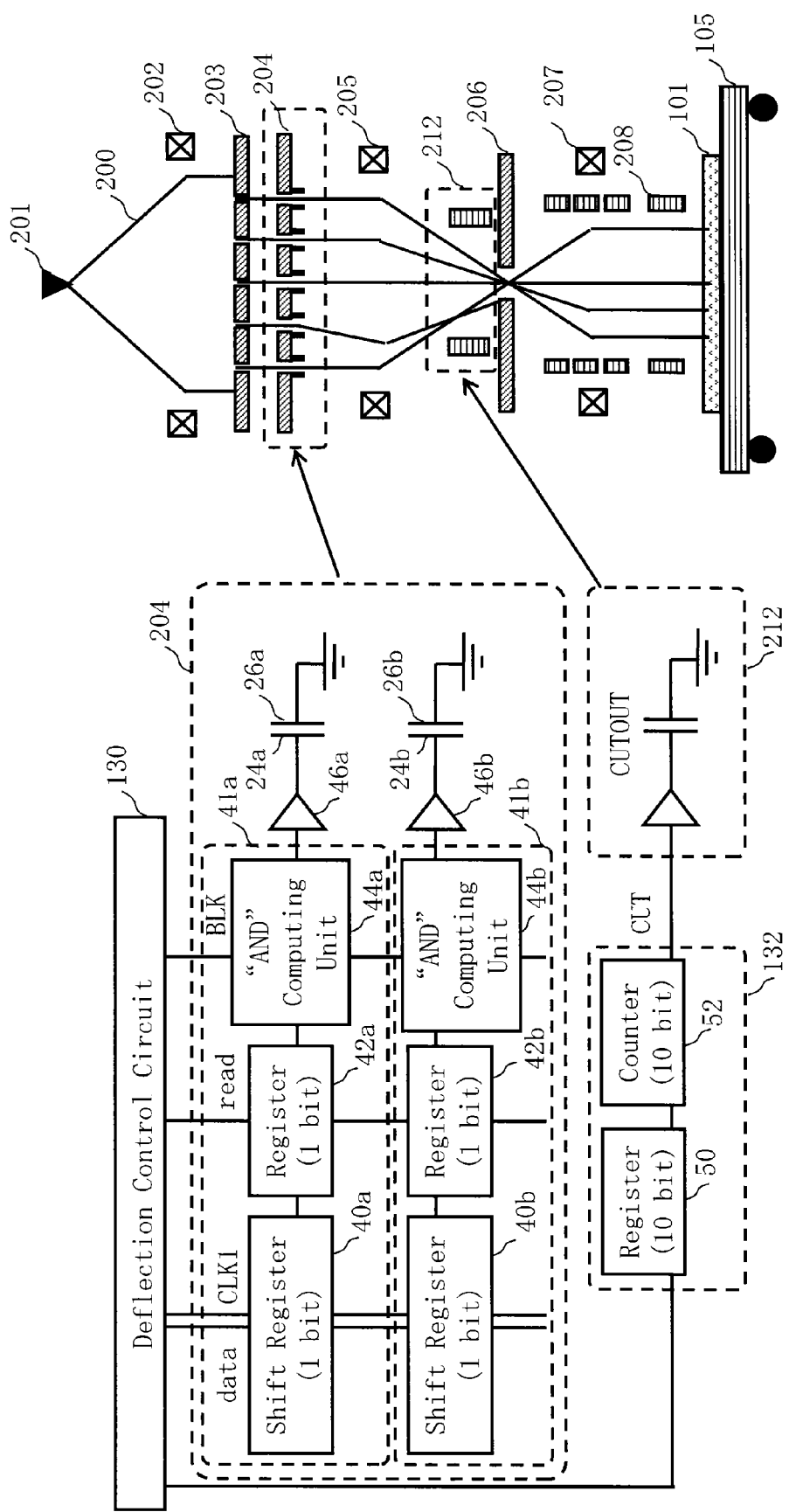
FIG. 5 is a schematic diagram showing an internal configuration of an individual blanking control circuit and a common blanking control circuit according to the first embodiment.

FIG. 5 is a schematic diagram showing the internal configuration of an individual blanking control circuit and a common blanking control circuit according to the first embodiment. Referring to FIG. 5, a shift register 40, a register 42, and an AND computing unit 44 (logical product computing unit) are arranged in each logic circuit 41 for respectively controlling a plurality of individual blanking systems arranged at the blanking plate 204 in the body of the writing apparatus 100. The AND computing unit 44 is used in order to compulsorily make all the individual blanking be OFF, for example, when a problem occurs in the register operation, but it may be omitted in the first embodiment. According to the first embodiment, a 1-bit control signal is used for individual blanking control for each beam, which has conventionally been controlled by, for example, a 10-bit control signal. That is, a 1-bit control signal is input/output into/from the shift register 40, the register 42, and the AND computing unit 44. Since the amount of information of a control signal is small, an installation area of the control circuit can be made small. In other words, even when a logic circuit is arranged on the blanking plate 204 whose installation space is small, more beams can be arranged at a smaller beam pitch. This enables the amount of current passing the blanking plate to be increased, and therefore, a writing throughput can be improved.

Moreover, an amplifier is arranged at the deflector 212 for a common blanking system, and a register 50 and a counter 52 (an example of a shot time control unit) are arranged at the logic circuit 132. These do not perform several different controlling at the same time, and therefore, it is sufficient to use one circuit to perform ON/OFF control. Accordingly, even when arranging a circuit for a high speed response, no problem occurs with respect to the restriction on the installation space and the current to be used in the circuit. Therefore, this amplifier is operated at very high speed compared with an amplifier realizable on a blanking aperture. This amplifier is controlled by a 10-bit control signal, for example. That is, for example, a 10-bit control signal is input/output into/from the register 50 and the counter 52.

According to the first embodiment, blanking control of each beam is performed by using both the beam ON/OFF control by each logic circuit 41 for a plurality of individual blanking systems described above and the beam ON/OFF control by the logic circuit 132 for a common blanking system that collectively control the entire multi beams.

Figure 6:
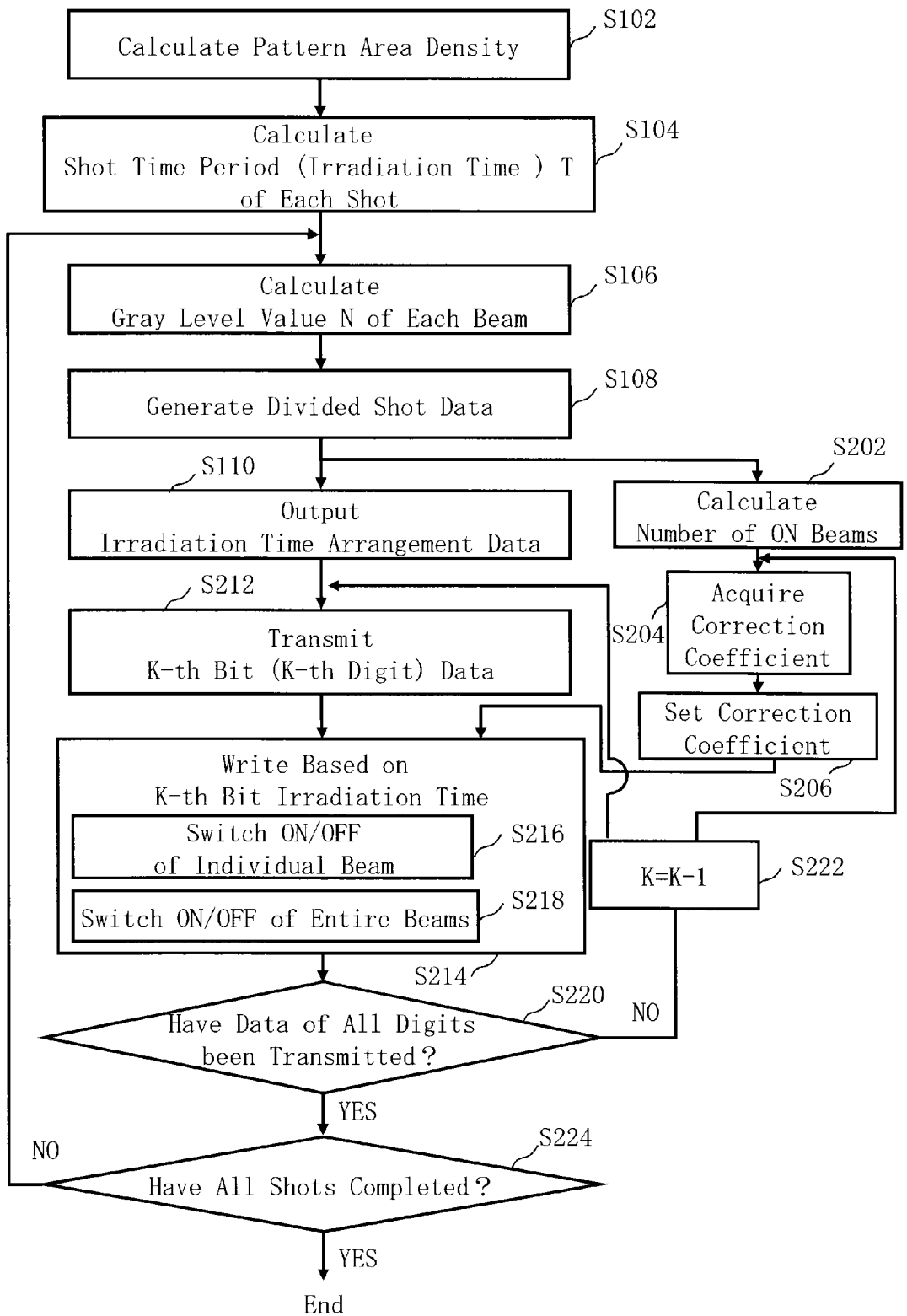
FIG. 6 is a flowchart showing main steps of a writing method according to the first embodiment.

FIG. 6 is a flowchart showing main steps of a writing method according to the first embodiment. In FIG. 6, a series of steps: a pattern area density calculation step (S102), a shot time period (irradiation time) T calculation step (S104), a gray level value N calculation step (S106), a divided shot data generation step (S108), an irradiation time arrangement data output step (S110), an ON beam number calculation step (S202), a correction coefficient acquisition step (S204), a correction coefficient setting step (S206), a target digit data transmission step (S212), a writing step (S214) based on an irradiation time of a target digit, a determination step (S220), a digit change step (S222), and a determination step (S224) are executed. The writing step (S214) based on an irradiation time of a target digit executes a series of steps as its internal steps: an individual beam ON/OFF switching step (S216) and an entire beams ON/OFF switching step (S218).

In the pattern area density calculation step (S102), the area density calculation unit 60 reads writing data from the storage device 140, and calculates the area density of a pattern arranged in the writing region of the target object 101 or in each mesh region of a plurality of mesh regions made by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The size density calculation unit 60 reads corresponding writing data from the storage device 140 for each stripe region, and assigns a plurality of figure patterns defined in the writing data to a mesh region, for example. Then, the area density of a figure pattern arranged in each mesh region is to be calculated.

In the shot time period (irradiation time) T calculation step (S104), the irradiation time calculation unit 62 calculates an irradiation time T (which hereinafter will also be called a shot time period or an exposure time) of the electron beam per shot, for each predetermined sized mesh region. When performing multi-pass writing, an irradiation time T of the electron beam per shot in each hierarchy (or "each writing process") of multi-pass writing is to be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations, such as a proximity effect, a fogging effect, or a loading effect not shown. The size of a plurality of mesh regions for defining the irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the gray level value N calculation step (S106), the gray level value calculation unit 64 calculates a gray level value N being an integer at the time of defining the irradiation time T for each mesh region, defined in the irradiation time map, by using a predetermined quantization unit $\Delta$. The irradiation time T is defined by the following equation (1).

$$T = \Delta N \quad (1)$$

Therefore, the gray level value N is defined as an integer value obtained by dividing the irradiation time T by a quantization unit $\Delta$. The quantization unit $\Delta$ can be variously set, and, for example, it can be defined by 1 ns (nanosecond), etc., for example. It is preferable that a value of 1 to 10 ns, for example, is used as the quantization unit $\Delta$. $\Delta$ indicates a quantization unit for controlling, such as a clock period, in the case of performing control by a counter.

In the divided shot data generation step (S108), the bit conversion unit 66 generates data for multiple times of divided shots such that irradiation for one shot of each beam is divided into a plurality of times of divided shots each having a different irradiation time, for each shot of multiple electron beams. The bit conversion unit 66 is an example of a divided shot data generation unit. For example, the bit conversion unit 66 converts an irradiation time for one shot into binary values. That is, the bit conversion unit 66 converts, for each shot, the irradiation time (in this case, a gray level value N) of each of multi beams into a predetermined n-digit binary value. For example, when N=50, since $50 = 2^1 + 2^4 + 2^5$, if converting it into a 10-digit binary value, it becomes "0000110010". This "0000110010" data is generated as data for a plurality of times of divided shots each having a different irradiation time. For example, if N=500, it is "0111110100". For example, if N=700, it is "1010111100". For example, if N=1023, it is "1111111111". The irradiation time of each beam is equivalent to an irradiation time defined for a mesh region to be irradiated by each beam of each shot. Thereby, the irradiation time T is defined by the following equation (2).

$$T = \Delta \sum_{k=0}^{n-1} a_k 2^k \quad (2)$$

$a_k$ indicates a value (1 or 0) of each digit in the case defining the gray level value N by a binary number. Although it is sufficient for n, being the number of digits, to be two or more, preferably it should be four or more digits, and more preferably, it should be eight or more digits.

According to the first embodiment, for each shot of beams, irradiation of each beam of each shot concerned is divided into irradiation of n times, where n indicates the number of digits. The irradiation of n times is equivalent to a combination of irradiations, where each irradiation is based on an irradiation time equivalent to each digit obtained by defining a converted binary number of a corresponding digit in decimal notation. In other words, one shot is divided into a plurality of irradiation steps of irradiation time periods of $\Delta a_0 2^0$, $\Delta a_1 2^1, \ldots, \Delta a_k 2^k, \ldots, \Delta a_{n-1} 2^{n-1}$. In the case of n=10, with n being the number of digits, one shot is divided into irradiation steps of 10 times.

For example, in the case of n=10, with n being the number of digits, if N=700, the irradiation time of the tenth digit (the tenth bit) is $\Delta \times 512$. The irradiation time of the ninth digit (the ninth bit) is $\Delta \times 0 = 0$. The irradiation time of the eighth digit (the eighth bit) is $\Delta \times 128$. The irradiation time of the seventh digit (the seventh bit) is $\Delta \times 0 = 0$. The irradiation time of the sixth digit (the sixth bit) is $\Delta \times 32$. The irradiation time of the fifth digit (the fifth bit) is $\Delta \times 16$. The irradiation time of the fourth digit (the fourth bit) is $\Delta \times 8$. The irradiation time of the third digit (the third bit) is $\Delta \times 4$. The irradiation time of the second digit (the second bit) is $\Delta \times 0 = 0$. The irradiation time of the first digit (the first bit) is $\Delta \times 0 = 0$.

For example, in the case of performing irradiation in order from the largest digit, if $\Delta = 1$ ns, the first irradiation step is 512 ns (beam ON) irradiation. The second irradiation step is 0 ns (beam OFF) irradiation. The third irradiation step is 128 ns (beam ON) irradiation. The fourth irradiation step is 0 ns (beam OFF) irradiation. The fifth irradiation step is 32 ns (beam ON) irradiation. The sixth irradiation step is 16 ns (beam ON) irradiation. The seventh irradiation step is 8 ns (beam ON) irradiation. The eighth irradiation step is 4 ns (beam ON) irradiation. The ninth irradiation step is 0 ns (beam OFF) irradiation. The tenth irradiation step is 0 ns (beam OFF) irradiation.

As described above, according to the first embodiment, for each shot of beams, irradiation of each beam of each shot concerned is divided into irradiation of n times, where n indicates the number of digits. The irradiation of n times is equivalent to a combination of irradiations, where each irradiation is based on an irradiation time equivalent to each digit obtained by defining a converted binary number of a corresponding digit in decimal notation. Then, as will be described later, the target object 101 is irradiated in order by a beam of irradiation time corresponding to each digit.

In the irradiation time arrangement data output step (S110), the transmission processing unit 68 outputs irradiation time arrangement data having been converted into plural divided shot data, for each beam shot, to the deflection control circuit 130.

Thereby, data of divided shot of each time of a plurality of times of divided shots of each beam is obtained. Therefore, information on multi beams has been acquired for performing each divided shot, where the information is concerning which beam is ON and which beam is OFF.

FIG. 7 shows an example of a part of irradiation time arrangement data according to the first embodiment. Referring to FIG. 7, there is shown a part of irradiation time arrangement data (plural divided shot data) of a predetermined shot of beams 1 to 5, for example, in the multi beams. The example of FIG. 7 shows irradiation time arrangement data of from the k-th bit (k-th digit) irradiation step to the (k−3)th bit ((k−3)th digit) irradiation step with respect to the beams 1 to 5. In the example of FIG. 7, as to the beam 1, data "1101" is described for the irradiation steps from the k-th bit (k-th digit) to the (k−3)th bit ((k−3)th digit). As to the beam 2, data "1100" is described for the irradiation steps from the k-th bit (k-th digit) to the (k−3) th bit ((k−3) th digit). As to the beam 3, data "0110" is described for the irradiation steps from the k-th bit (k-th digit) to the (k−3)th bit ((k−3)th digit). As to the beam 4, data "0111" is described for the irradiation steps from the k-th bit (k-th digit) to the (k−3)th bit ((k−3)th digit). As to the beam 5, data "1011" is described for the irradiation steps from the k-th bit (k-th digit) to the (k−3)th bit ((k−3)th digit).

As described above, plural divided shot data, per shot of each beam composing multi beams, is obtained. Then, according to the first embodiment, a correction coefficient for correcting position deviation of a writing pattern caused by the space charge effect is acquired using the plural divided shot data. Hereafter, it will be explained concretely.

In the ON beam number calculation step (S202), the ON beam number calculation unit 74 calculates the number of ON beams of multi beams for each divided shot.

Figure 8:
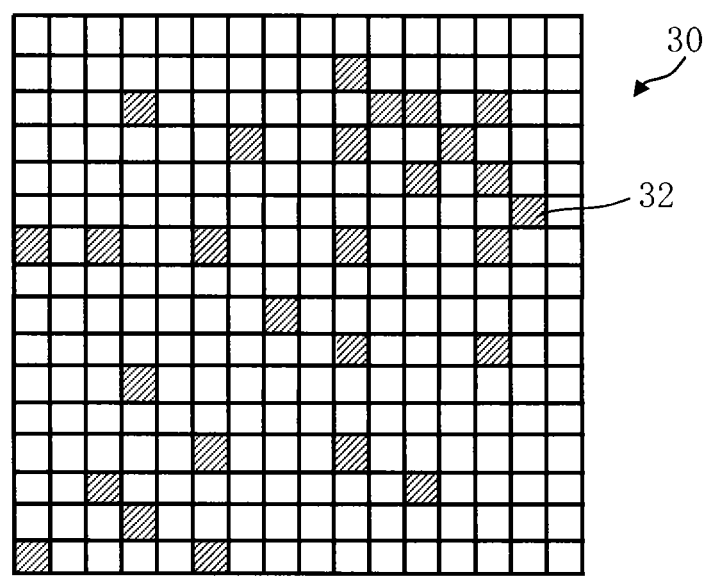
FIG. 8 shows an example of an ON-beam pattern of multi beams according to the first embodiment.

FIG. 8 shows an example of an ON-beam pattern of multi beams according to the first embodiment. For example, the number of beams of multi beams that can be irradiated at a time, by using the aperture member 203 wherein m×n (m≥2, n≥2) holes are arranged in m columns in the vertical direction (the y direction) and n rows in the horizontal direction (the x direction), is a number equivalent to m×n (m being the number of columns and n being the number of rows). FIG. 8 shows an example of a beam pattern of an ON beam 32, for example, which is emitted in the case of divided shot of the k-th bit, in an irradiation region 30 of the (m×n) multi beams. In other words, there is shown an example of a pattern of a beam which reaches the target object 101 without becoming beam OFF by blanking control. FIG. 8 shows an example of the number of ON beams in the entire multi beams that irradiate in the case of divided shot of the k-th bit, for example. The beam pattern of the ON-beam 32 may differ for each divided shot, for example. By obtaining the number of ON beams, it is possible to acquire the amount of beam current of the entire multi beams in each of a plurality of times of divided shots. In multi-beam writing, deviation occurs, by the space charge effect, in the rate of elasticity and/or in the focusing of an image of the entire multi beams in accordance with the amount of beam current (beam intensity). For example, as the beam intensity becomes large, deviation of the elastic rate and the focus of an image of the entire multi beams also becomes large. In particular, deviation of especially the beams located at the ends in the multi beams becomes remarkably large. Then, according to the first embodiment, a correction coefficient of the elastic rate for the reference elastic rate of an image of the entire multi beams with respect to each number of ON beams is obtained in advance by making the amount of beam current (the number of ON beams) variable based on an experiment etc. Then, an elastic rate correction table is generated in which correction coefficients of the elastic rate are defined to be corresponding to the number of ON beams. Similarly, a correction coefficient of the focus position for the reference focus position with respect to each number of ON beams is obtained in advance by making the amount of beam current (the number of ON beams) variable based on an experiment etc. Then, a focus correction table is generated in which correction coefficients of the focus are defined to be corresponding to the number of ON beams. The elastic rate correction table and the focus correction table are stored in the storage device 144.

Elastic rate correction and focus correction are performed as described above. In addition, since deviation occurs in astigmatism correction when deviation occurs in the focus position, it is also preferable to obtain an astigmatism correction coefficient with respect to each number of ON beams in advance by making the amount of beam current (the number of ON beams) variable based on an experiment etc. An astigmatism correction table may be generated in which astigmatism correction coefficients are defined to be corresponding to the number of ON beams. The astigmatism correction table may be stored in the storage device 144. As to the method of obtaining a correction coefficient, for example, it is also possible to write a pattern while changing conditions and obtain a correction coefficient based on a measurement result of the written pattern. Moreover, a correction coefficient can also be obtained by arranging a mark on the stage to measure the mark position under various conditions. Alternatively, a correction coefficient can also be obtained by measuring a beam resolution. When the amount of correction is comparatively small, precise correction can be performed by setting a correction coefficient which has been acquired as a design value by simulation, etc. of an electron optical system.

In the correction coefficient acquisition step (S204), the coefficient acquisition unit 76 refers to the elastic rate correction table stored in the storage device 144 in order to acquire, for each divided shot, an elastic rate correction value (in this case, for example, an elastic rate correction coefficient for a reference elastic rate) which corrects an elastic rate of an image of the entire multi beams, in accordance with the number of ON beams of multi beams. The coefficient acquisition unit 80 is an example of an elastic rate correction value acquisition unit. Moreover, the coefficient acquisition unit 80 refers to the focus correction table stored in the storage device 144 in order to acquire, for each divided shot, a focus position correction value (in this case, for example, a focus correction coefficient for a reference focus position) which corrects a focus position of the entire multi beams. The coefficient acquisition unit 80 is an example of a focus position correction value acquisition unit.

When the astigmatism correction table is stored in a storage device, the coefficient acquisition unit 84 refers to the astigmatism correction table stored in the storage device 144 in order to acquire, for each divided shot, an astigmatism correction value (in this case, for example, an astigmatism correction coefficient for the state where no astigmatism occurs) which corrects an astigmatism, in accordance with the number of ON beams of multi beams.

In the correction coefficient setting step (S206), the coefficient setting unit 78 sets, for each divided shot, an elastic rate correction coefficient in the DAC amplifier 134. Similarly, the coefficient setting unit 82 sets, for each divided shot, a focus correction coefficient in the DAC amplifier 136. One of a pair of voltages is set in the DAC amplifier 134 and the other of the pair is set in the DAC amplifier 136 previously so that the focus position obtained by the objective lens 207 may not change (focus deviation may not occur) in the reference current amount, and an elastic rate of the image of the entire multi beams may be the reference elastic rate which has been pre-set.

When the astigmatism correction table is stored in the storage device, the coefficient setting unit 86 sets, for each divided shot, an astigmatism correction coefficient in the DAC amplifier 138. An astigmatism correction lens may be independently set. However, in this case, it is preferable to make the deflector 208 have a function as an astigmatism correction lens. The deflector 208 is composed of a plurality of electrodes divided, for example, octally in the direction of the circumference. Thereby, beams can be deflected in the x and y directions. Although, in FIG. 1, only the DAC amplifier 138 is depicted for the deflector 208, it should be understood that DAC amplifiers are respectively connected to the electrodes.

In the target digit data transmission step (S212), the deflection control circuit 130 outputs, for each shot, irradiation time arrangement data to the logic circuit 41 for each beam. Moreover, synchronized with this, the deflection control circuit 130 outputs timing data of each irradiation step to the logic circuit 132 for common blanking.

According to the first embodiment, as shown in FIG. 5, since the shift register 40 is used for the logic circuit 41, the deflection control circuit 130 transmits data of the same bit (the same number of digits) to each logic circuit 41 of the blanking plate 204 in the order of beam arrangement (or in the order of identification number). Moreover, a clock signal (CLK1) for synchronization, a read signal (read) for data read-out, and a gate signal (BLK) are output. In the example of FIG. 7, as data of the k-th bit (k-th digit) of the beams 1 to 5, each one bit data of "10011" is transmitted from the posterior beam. The shift register 40 of each beam transmits data to the next shift register 40 in order from the top, based on a clock signal (CLK1). For example, with respect to the data of the k-th bit (k-th digit) of the beams 1 to 5, based on clock signals of five times, "1" being one bit data is stored in the shift register 40 of the beam 1. "1" being one bit data is stored in the shift register 40 of the beam 2. "0" being one bit data is stored in the shift register 40 of the beam 3. "0" being one bit data is stored in the shift register 40 of the beam 4. "1" being one bit data is stored in the shift register 40 of the beam 5.

Next, in response to an input of a read signal (read), the register 42 of each beam reads the data of the k-th bit (k-th digit) of each beam from the shift register 40. In the example of FIG. 7, as the data of the k-th bit (k-th digit), "1" being one bit data is stored in the register 42 of the beam 1. As the data of the k-th bit (k-th digit), "1" being one bit data is stored in the register 42 of the beam 2. As the data of the k-th bit (k-th digit), "0" being one bit data is stored in the register 42 of the beam 3. As the data of the k-th bit (k-th digit), "0 being one bit data is stored in the register 42 of the beam 4. As the data of the k-th bit (k-th digit), "1" being one bit data is stored in the register 42 of the beam 5. When inputting the data of the k-th bit (k-th digit), the individual register 42 of each beam outputs, based on the data, an ON/OFF signal to the AND computing unit 44. If the data of the k-th bit (k-th digit) is "1", an ON signal is output, and if it is "0", an OFF signal is output. Then, when the BLK signal is an ON signal and the signal of the register 42 is ON, the AND computing unit 44 outputs an ON signal to the amplifier 46, and the amplifier 46 applies an ON voltage to the electrode 24 of the individual blanking deflector. In the case other than the above, the AND computing unit 44 outputs an OFF signal to the amplifier 46, and the amplifier 46 applies an OFF voltage to the electrode 24 of the individual blanking deflector.

While the data of the k-th bit (k-th digit) is being processed, the deflection control circuit 130 transmits the data of the (k−1)th bit ((k−1)th digit) to each logic circuit 41 of the blanking plate 204, in the order of beam arrangement (or in the order of identification number). In the example of FIG. 7, as the data of the (k−1)th bit ((k−1)th digit) of the beams 1 to 5, each one bit data of "01111" is transmitted from the posterior beam. The shift register 40 of each beam transmits the data to the next shift register 40 in order from the top, based on a clock signal (CLK1). For example, with respect to the data of the (k−1)th bit ((k−1)th digit) of the beams 1 to 5, based on clock signals of five times, "1" being one bit data is stored in the shift register 40 of the beam 1. "1" being one bit data is stored in the shift register 40 of the beam 2. "1" being one bit data is stored in the shift register 40 of the beam 3. "1" being one bit data is stored in the shift register 40 of the beam 4. "0" being one bit data is stored in the shift register 40 of the beam 5. Based on the read signal of the (k−1)th bit ((k−1)th digit), the register 42 of each beam reads data of the (k−1)th bit ((k−1)th digit) of each beam, from the shift register 40. Similarly, it should go to the data processing of the first bit (the first digit)

The AND computing unit 44 shown in FIG. 5 may be omitted. However, it is effective in that a beam can be controlled to be OFF by the AND computing unit 44 in the case of not being able to make the beam OFF because of a trouble of elements of the logic circuit 41. Although a data transmission channel for one bit where the shift registers are arranged in series is used in FIG. 5, it is also effective to provide a plurality of parallel transmission channels in order to improve the speed of transmission.

In the writing step (S214) based on an irradiation time of a target digit, for each beam shot, writing is performed based on the irradiation time of a target digit (for example, the k-th bit (k-th digit)) in irradiation having been divided into a plurality of irradiation steps (divided shots). Moreover, synchronized with a divided shot of the target digit (for example, the k-th bit (the k-th digit)), the electrostatic lens 214 (the first lens) corrects, for each divided shot, the elastic rate of the image of the entire multi beams, depending upon a voltage applied from the DAC amplifier 134, by using an elastic rate correction value. Simultaneously, synchronized with a divided shot of the target digit (for example, the k-th bit (the k-th digit)), the electrostatic lens 216 (the second lens) corrects, for each divided shot, the focus position of the entire multi beams, depending upon a voltage applied from the DAC amplifier 136, by using a focus correction coefficient (an example of a focus position correction value). Moreover, simultaneously, synchronized with a divided shot of the target digit (for example, the k-th bit (the k-th digit)), the deflector 208 corrects, for each divided shot, the astigmatism of the entire multi beams, depending upon a voltage applied from the DAC amplifier 138, by using an astigmatism correction coefficient (an example of an astigmatism correction value).

Figure 9:
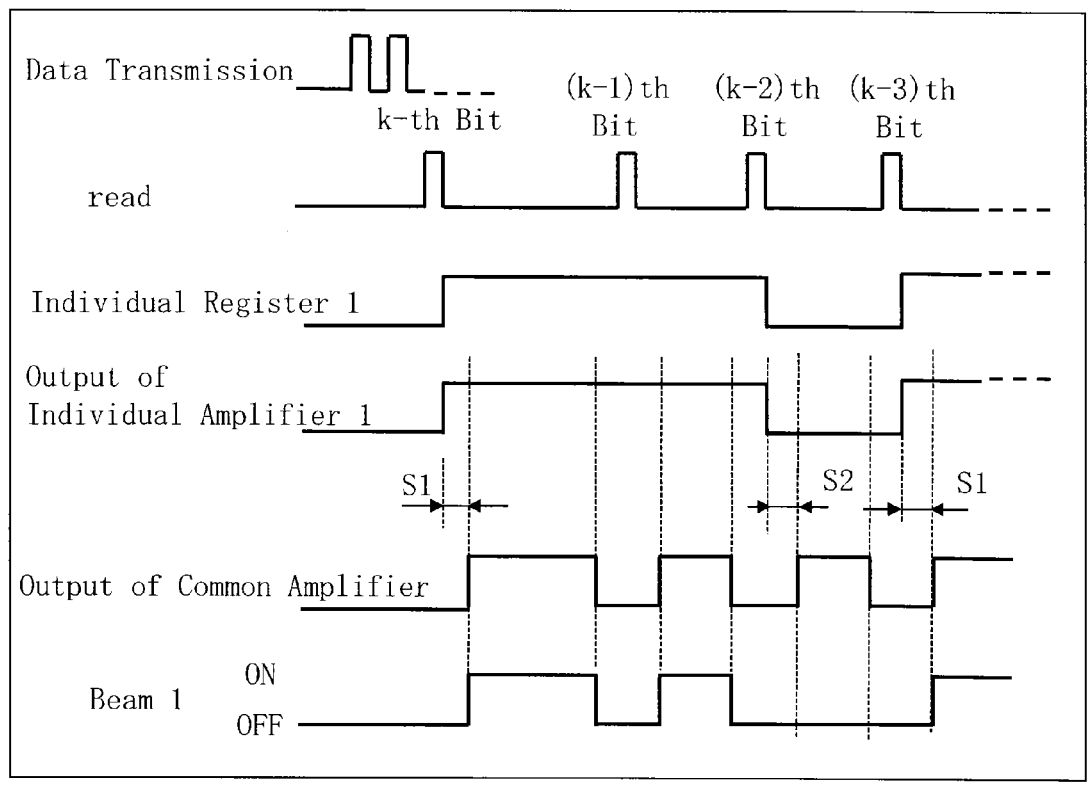
FIG. 9 is a flowchart showing a beam ON/OFF switching operation with respect to a part of an irradiation step of one shot according to the first embodiment.

FIG. 9 is a flowchart showing a beam ON/OFF switching operation with respect to a part of an irradiation step of one shot according to the first embodiment. FIG. 9 shows one beam (beam 1) in multi beams. In the example of FIG. 7, the irradiation time arrangement data of the k-th bit (k-th digit) to the (k−3)th bit ((k−3)th digit) is represented by "1101". First, in response to an input of a read signal of the k-th bit (the k-th digit), the individual register 42 (individual register 1) outputs an ON/OFF signal based on the stored data of the k-th bit (the k-th digit). Referring to FIG. 8, an ON signal is output. According to the first embodiment, since it is the case of a 1-bit signal, with respect to the individual register 42, data output is maintained until the next (k−1)th bit ((k−1)th digit) data is read.

Since the data of the k-th bit (k-th digit) is data indicating ON, the individual amplifier 46 (individual amplifier 1) outputs an ON voltage to be applied to the blanking electrode 24 for the beam 1. On the other hand, in the logic circuit 132 for common blanking, ON or OFF is switched depending upon timing data of ten bits of each irradiation step. In the common blanking system, an ON signal is output during the irradiation time of each irradiation step. For example, if $\Delta=1$ ns, the irradiation time of the first irradiation step (for example, the tenth digit (the tenth bit)) is $\Delta \times 512 = 512$ ns. The irradiation time of the second irradiation step (for example, the ninth digit (the ninth bit)) is $\Delta \times 256 = 256$ ns. The irradiation time of the third irradiation step (for example, the eighth digit (the eighth bit)) is $\Delta \times 128 = 128$ ns. Similarly, an ON signal is output during the irradiation time of each digit (each bit), hereinafter. In the logic circuit 132, when timing data of each irradiation step is input into the register 50, the register 50 outputs data indicating ON of the k-th digit (k-th bit), the counter 52 counts the irradiation time of the k-th digit (k-th bit), and controlling is performed to be OFF after the irradiation time has passed.

In the common blanking system, compared with ON/OFF switching of the individual blanking system, ON/OFF switching is performed after the voltage stabilization time (settling time) S1/S2 of the amplifier 46 has passed. In the example of FIG. 9, after the individual amplifier 1 has become ON and the settling time S1 of the individual amplifier 1 at the time of switching from OFF to ON has passed, the common amplifier becomes ON. Thereby, beam irradiation at an unstable voltage at the time of rise of the individual amplifier 1 can be eliminated. Then, the common amplifier becomes OFF when the irradiation time of the k-th digit (k-th bit) has passed. Consequently, in the case of both the individual amplifier and the common amplifier being ON, an actual beam becomes ON, and irradiates the target object 101. Therefore, it is controlled such that the ON time of the common amplifier becomes the irradiation time of the actual beam. In other words, the common blanking system specifies the irradiation time. That is, it is controlled such that the common amplifier and the deflector 212 specify the irradiation time by using the counter 52 (irradiation time control unit). On the other hand, in the case where the common amplifier becomes ON when the individual amplifier 1 is OFF, after the individual amplifier 1 becomes OFF and the settling time S2 of the individual amplifier 1 at the time of switching from ON to OFF has passed, the common amplifier becomes ON. Thereby, beam irradiation at an unstable voltage at the time of fall of the individual amplifier 1 can be eliminated. As described in FIG. 9, if the operation of the individual amplifier starts after the common amplifier is turned off, an unstable operation is eliminated and accurate beam irradiation is executed. Moreover, if the DAC amplifier of the electrostatic lens for correction is also controlled at the same timing as that of the individual amplifier, an unstable operation is eliminated and accurate beam irradiation is executed.

As described above, in the individual beam ON/OFF switching step (S216), a plurality of individual blanking systems (blanking plate 204, etc.) individually execute blanking control of each of multi beams, based on data for a plurality of times of divided shots. Specifically, beam ON/OFF control is individually performed for a corresponding beam in multi beams by a plurality of individual blanking systems (blanking plate 204, etc.), and, for each beam, with respect to the irradiation step (irradiation) of the k-th digit (k-th bit), beam ON/OFF switching is performed by the individual blanking system for the beam concerned. In the example of FIG. 9, since the beam is not in the OFF state in the irradiation step of the (k−1)th digit ((k−1)th bit), switching from ON to OFF is not performed. However, for example, if the beam is in the OFF state in the irradiation step of the (k−1)th digit ((k−1)th bit), it should be understood that switching from ON to OFF is performed.

In the entire beams ON/OFF switching step (S218), with respect to the irradiation step (irradiation) of the k-th digit (k-th bit), beam ON/OFF controlling is collectively performed by the common blanking system (the logic circuit 132, the deflector 212, etc.) for the entire multi beams, in addition to performing beam ON/OFF switching for each beam by the individual blanking system, and blanking control is performed so that the beam may be in the ON state during the irradiation time corresponding to the irradiation step (irradiation) of the k-th digit (k-th bit).

Since there is a restriction on the installation area of the circuit and the current to be used in the circuit in the blanking plate 204, a simple amplifier circuit is used. Therefore, it is also limited in reducing the settling time of the individual amplifier. By contrast, in the common blanking system, a highly precise amplifier circuit of sufficient size, current, and scale can be installed outside the electron optical column. Therefore, the settling time of the common amplifier can be shortened. Thus, according to the first embodiment, it is possible to eliminate a voltage unstable time and a noise component containing crosstalk of the individual amplifier on the blanking plate and to perform a blanking operation based on a highly precise irradiation time by, after the beam becomes in the ON state by the individual blanking system (or after a read signal of a target digit is output), letting the beam to be ON by the common blanking system after the settling time has passed.

In the determination step (S220), the writing control unit 72 determines whether transmission of irradiation time arrangement data with respect to all the digits has been completed or not. When it has not been completed yet, it goes to the digit change step (S222). When it has been completed, it goes to the determination step (S224).

In the digit change step (S222), the writing control unit 72 changes a target bit (digit). For example, the target digit is changed to the (k−1)th digit ((k−1)th bit) from the k-th digit (k-th bit). Then, it returns to the target digit data transmission step (S212). Simultaneously, it returns to the correction coefficient acquisition step (S204). Then, with respect to the processing of the (k−1)th digit ((k−1)th bit), the steps from the correction coefficient acquisition step (S204) to the digit change step (S222) are executed. Then, it is similarly repeated until processing of data of all the digits with respect to irradiation time arrangement data has been completed in the determination step (S220).

In the example of FIG. 9, after the beam ON time for the irradiation step of the k-th digit (k-th bit) has passed, a read signal of the (k−1)th digit ((k−1)th bit) is input into the register 42. In the register 42, as to the beam 1, since the data of the (k−1)th digit ((k−1)th bit) "1", it is continued to output an ON signal. Therefore, the output of the individual amplifier 1 becomes ON, and an ON voltage is applied to the electrode 24 for individual blanking. Similarly, after the settling time of the individual amplifier 1 has passed, the beam is made to be ON by the common blanking system. Then, after the irradiation time of the (k−1)th digit ((k−1)th bit) has passed, the beam is made to be OFF by the common blanking system.

Next, after the beam ON time for the irradiation step of the (k−1)th digit ((k−1)th bit) has passed, a read signal of the (k−2)th digit ((k−2)th bit) is input into the register 42. In the register 42, as to the beam 1, since the data of the (k−2)th digit ((k−2)th bit) is "0", it is switched to output an OFF signal. Therefore, the output of the individual amplifier 1 becomes OFF, and an OFF voltage is applied to the electrode 24 for individual blanking. Similarly, after the settling time of the individual amplifier 1 has passed, the beam is made to be ON by the common blanking system. However, since the output of the individual amplifier 1 is OFF, consequently, the beam 1 is made to be OFF. Then, after the irradiation time of the (k−2)th digit ((k−2)th bit) has passed, the beam is made to be OFF by the common blanking system.

Next, after the beam ON time for the irradiation step of the (k−2)th digit ((k−2)th bit) has passed, a read signal of the (k−3)th digit ((k−3)th bit) is input into the register 42. In the register 42, as to the beam 1, since the data of the (k−3)th digit ((k−3)th bit) is "1", it is switched to output an ON signal. Therefore, the output of the individual amplifier 1 becomes ON, and an ON voltage is applied to the electrode 24 for individual blanking. Similarly, after the settling time of the individual amplifier 1 has passed, the beam is made to be ON by the common blanking system. This time, since the output of the individual amplifier 1 is ON, consequently, the beam 1 is made to be ON. Then, after the irradiation time of the (k−3)th digit ((k−3)th bit) has passed, the beam is made to be OFF by the common blanking system.

As described above, for each beam in multi beams, beam ON/OFF switching is performed by the individual blanking system for the beam concerned, with respect to each time irradiation of irradiation performed the number of times equal to the number of digits (divided shots performed the number of times equal to the number of digits), by using a plurality of individual blanking systems that respectively perform beam ON/OFF control of a corresponding beam in the multi beams. Simultaneously, with respect to each time irradiation of irradiation performed the number of times equal to the number of digits (divided shots performed the number of times equal to the number of digits), in addition to performing beam ON/OFF switching for each beam by the individual blanking system, blanking control is performed by the common blanking system which collectively performs beam ON/OFF control for the entire multi beams so that the state of the beam may be ON during the irradiation time corresponding to irradiation of the digit concerned. By switching the operation of the individual blanking system, the common blanking system, and the electrostatic lens for correction, a beam of the irradiation time respectively corresponding to each digit irradiates the target object 101 in order.

Thus, since an ON-beam pattern is maintained constant during each divided shot, the amount of beam current is also maintained constant, and, further, the space charge effect during each divided shot is also maintained constant. Therefore, according to the first embodiment, the elastic rate of an image of the entire multi beams is corrected for each divided shot. Simultaneously, a focus deviation is corrected for each divided shot. Simultaneously, astigmatism is corrected for each divided shot. Thereby, it is possible to correct a position deviation caused by the space charge effect in accordance with change of the beam current amount in one shot.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector: individual blanking system) of the blanking plate 204. Each blanker respectively deflects (performs blanking deflection) the electron beam 20 passing individually.

Figure 10:
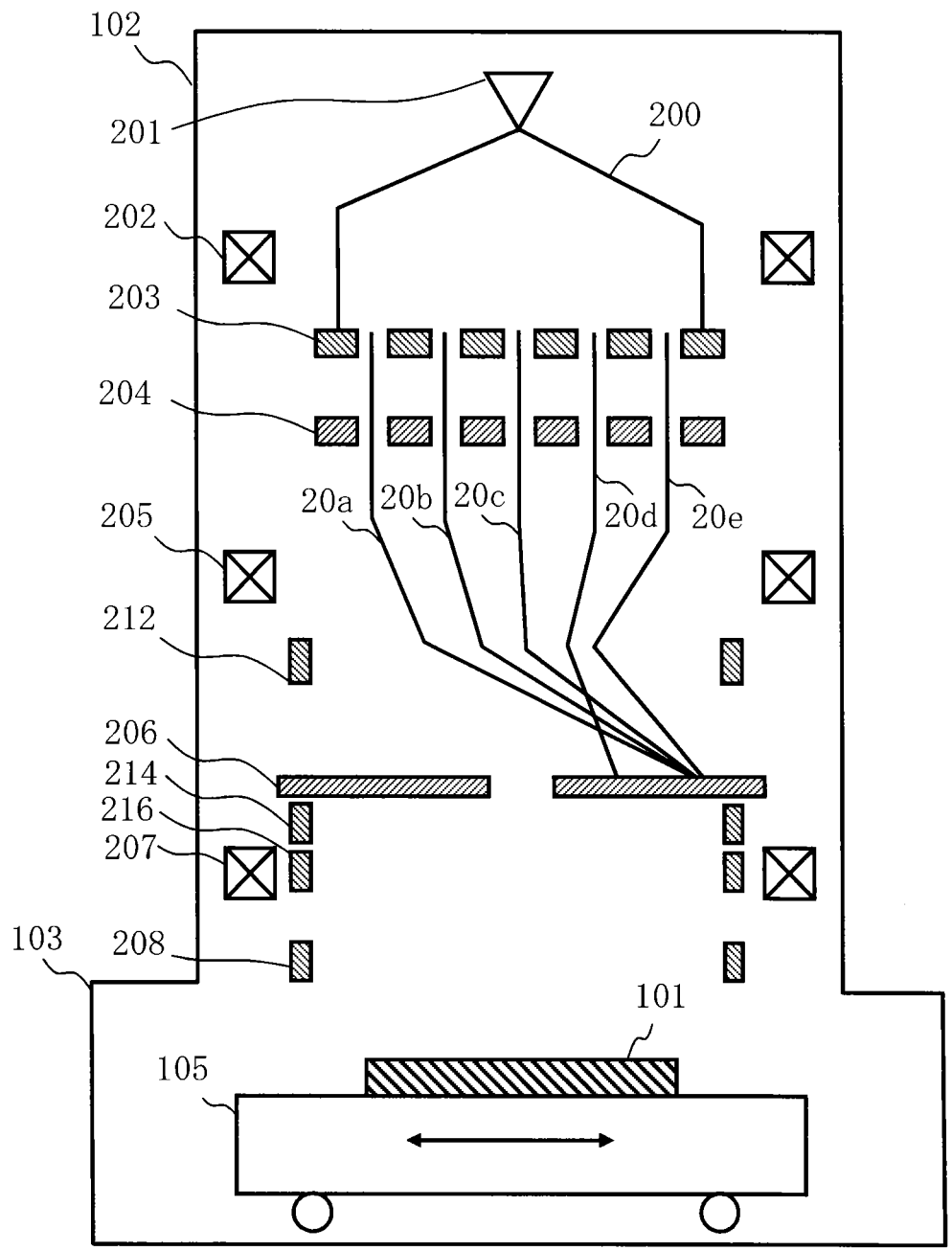
FIG. 10 is a schematic diagram explaining a blanking operation according to the first embodiment.

FIG. 10 is a schematic diagram explaining a blanking operation according to the first embodiment. The multiple beams 20a, 20b, ..., 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, if the electron beam 20 which was not deflected by the blanker of the blanking plate 204 is not deflected by the deflector 212 (common blanking system), it passes through the hole at the center of the limiting aperture member 206, as shown in FIG. 1. Blanking control is performed by combination of ON/OFF of the individual blanking system and ON/OFF of the common blanking system so as to control ON/OFF of the beam. Thus, the limiting aperture member 206 blocks each beam which was deflected to be a beam OFF state by the individual blanking system or the common blanking system. Then, beam of an irradiation step obtained by dividing one beam shot is formed by beams having been made during from a beam ON state to a beam OFF state and having passed through the limiting aperture member 206. The multi beams 20 having passed through the limiting aperture member 206 are focused by the objective lens 207 in order to be a pattern image of a desired reduction ratio, and respective beams (the entire multi beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

In the determination step (S224), the writing control unit 72 determines whether all the shots have been completed. If all the shots have been completed, it ends. If all the shots have not been completed yet, it returns to the gray level value N calculation step (S106), and the steps from the gray level value N calculation step (S106) to the determination step (S224) are repeated until all the shots have been completed.

Figure 11:
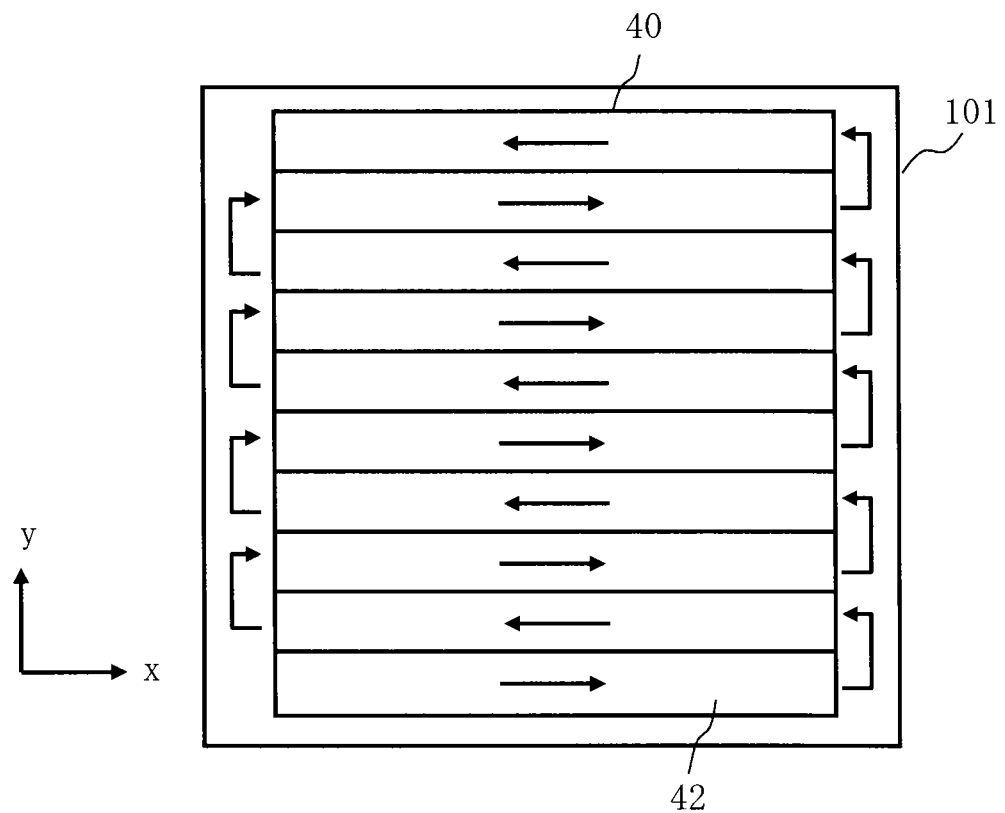
FIG. 11 is a conceptual diagram explaining a writing operation according to the first embodiment.

FIG. 11 is a conceptual diagram explaining a writing operation according to the first embodiment. As shown in FIG. 11, a writing region 40 of the target object 101 is virtually divided into a plurality of strip-shaped stripe regions 42 each having a predetermined width in the y direction, for example. Each of the stripe regions 42 serves as a writing unit region. The XY stage 105 is moved and adjusted such that an irradiation region 30 to be irradiated with one-time irradiation of the multi beams 20 is located at the left end of the first stripe region 42 or at a position more left than the left end, and then writing is started. When writing the first stripe region 42, the writing advances relatively in the x direction by moving the XY stage 105 in the −x direction, for example. The XY stage 105 is continuously moved at a predetermined speed, for example. After writing the first stripe region 42, the stage position is moved in the −y direction and adjusted such that the irradiation region is located at the right end of the second stripe region 42 or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region 42, and in the −x direction in the fourth stripe region 42, and thus, the writing time can be reduced. However, the writing operation is not limited to the case of performing writing while alternately changing the direction, and it is also acceptable to perform writing in the same direction when writing each stripe region 42. By one shot, a plurality of shot patterns of the same number as the holes 22 are formed at a time by multiple beams which have been formed bypassing through respective corresponding holes 22 of the aperture member 203.

Figure 12A:
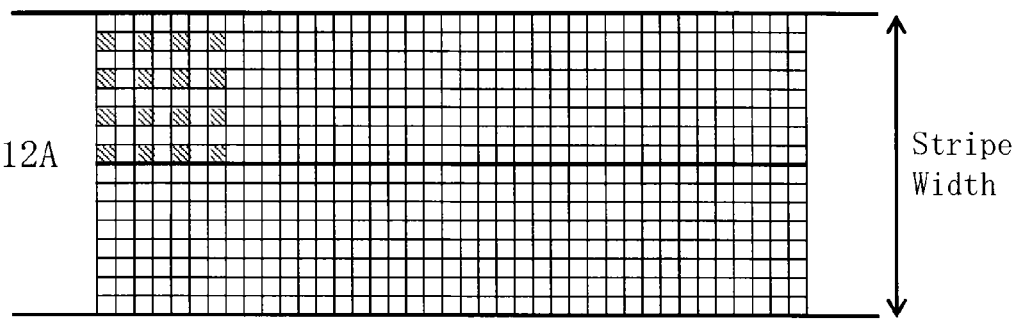
FIGS. 12A to 12C are conceptual diagrams explaining examples of a writing operation in a stripe according to the first embodiment.
Figure 12B:
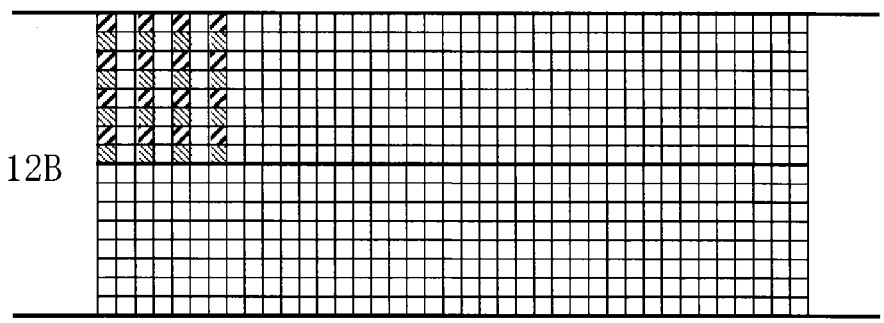
Figure 12C:
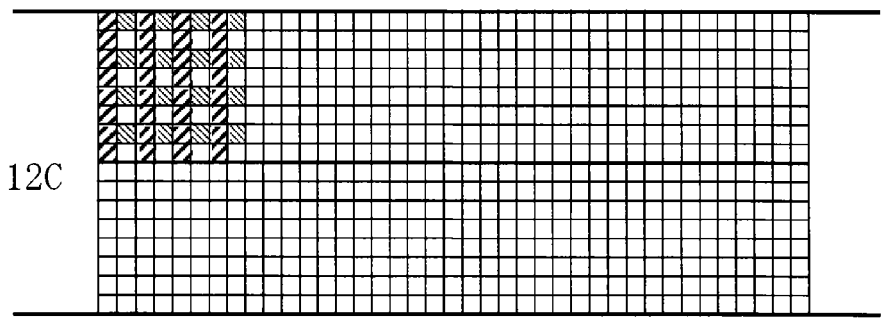

FIGS. 12A to 12C are conceptual diagrams explaining examples of a writing operation in a stripe according to the first embodiment. The examples of FIGS. 12A to 12C show the cases where writing is performed in a stripe by using multiple beams of 4×4 in the x and y directions, for example. The examples of FIGS. 12A to 12C show the cases where a stripe region is divided in the y direction by twice the width of an irradiation region of the whole multi-beam, for example. There is shown the case where exposure (writing) of one irradiation region by the entire multi beams is completed by shots of four times (one shot is a total of a plurality of irradiation steps) performed while shifting the irradiation position by one mesh in the x direction or the y direction. First, the upper region of the stripe region is to be written. FIG. 12A shows the mesh region irradiated by the first one-shot (one shot is a total of a plurality of irradiation steps). Next, as shown in FIG. 12B, the second one-shot (one shot is a total of a plurality of irradiation steps) is performed while shifting the position in the y direction to the mesh region having not been irradiated yet. Next, as shown in FIG. 12C, the third one-shot (one shot is a total of a plurality of irradiation steps) is performed while shifting the position in the x direction to the mesh region having not been irradiated yet.

Figure 13A:
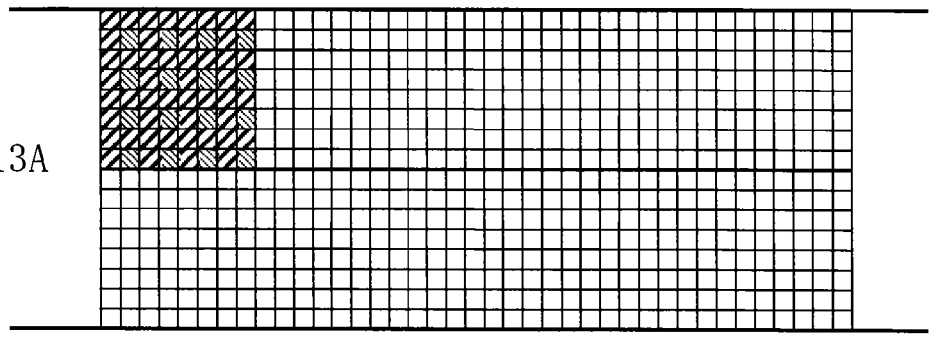
FIGS. 13A to 13C are conceptual diagrams explaining examples of a writing operation in a stripe according to the first embodiment.
Figure 13B:
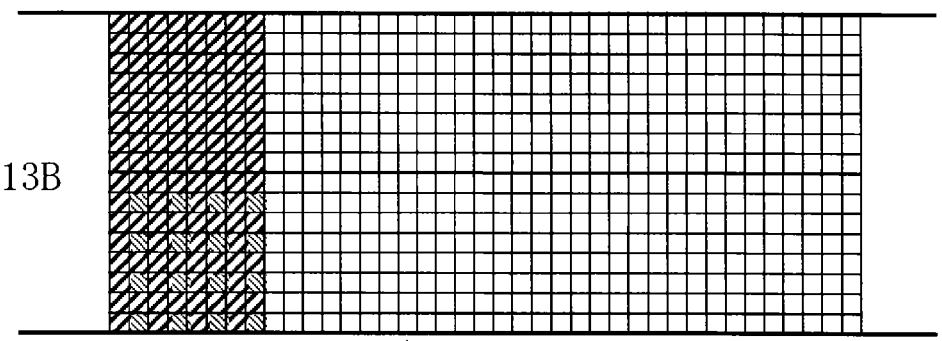
Figure 13C:
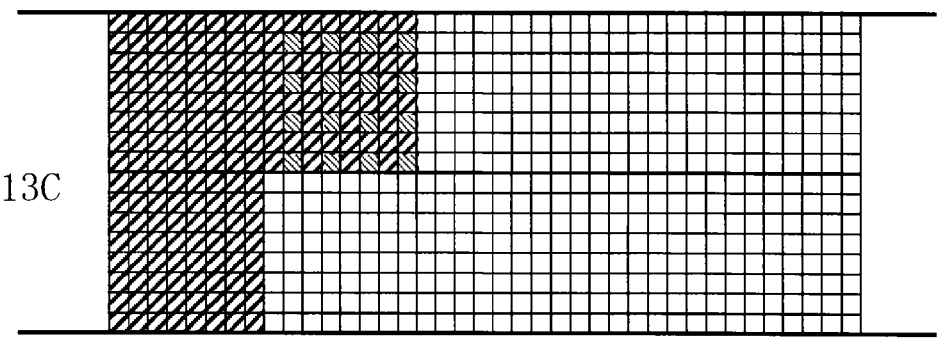

FIGS. 13A to 13C are conceptual diagrams explaining examples of a writing operation in a stripe according to the first embodiment. FIGS. 13A to 13C are continued from FIG. 12C. As shown in FIG. 13A, the fourth one-shot (one shot is a total of a plurality of irradiation steps) is performed while shifting the position in the y direction to the mesh region having not been irradiated yet. Exposure (writing) of one of irradiation regions for the entire multi beams is completed by these four times shots (one shot is a total of a plurality of irradiation steps). Next, the lower region of the stripe region is to be written. As shown in FIG. 13B, the lower region of the stripe region is irradiated by the first one-shot (one shot is a total of a plurality of irradiation steps). Next, the second one-shot (one shot is a total of a plurality of irradiation steps) is performed while shifting the position in the y direction to the mesh region having not been irradiated yet. Next, the third one-shot (one shot is a total of a plurality of irradiation steps) is performed while shifting the position in the x direction to the mesh region having not been irradiated yet. The fourth one-shot (one shot is a total of a plurality of irradiation steps) is performed while shifting the position in the y direction to the mesh region having not been irradiated yet. By the operations described above, writing of the first row in the stripe region in the irradiation region of multi beams is completed. Then, as shown in FIG. 13C, writing is to be similarly performed for the second row of the multi-beam irradiation region while shifting the position in the x direction. The whole stripe region can be written by repeating the operations described above.

Figure 14A:
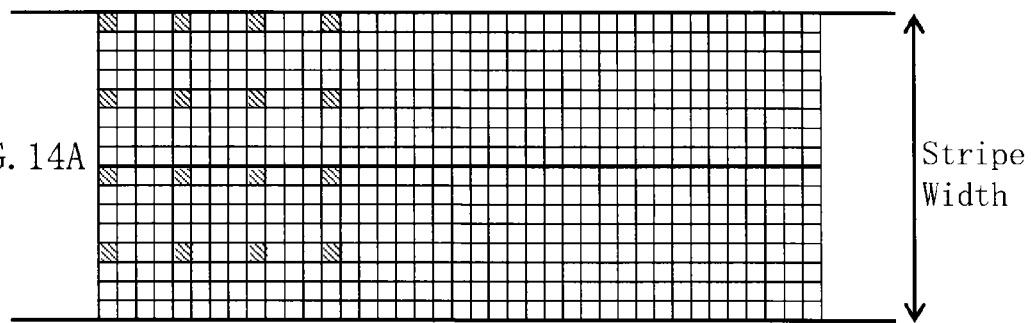
FIGS. 14A to 14C are conceptual diagrams explaining other examples of a writing operation in a stripe according to the first embodiment.
Figure 14B:
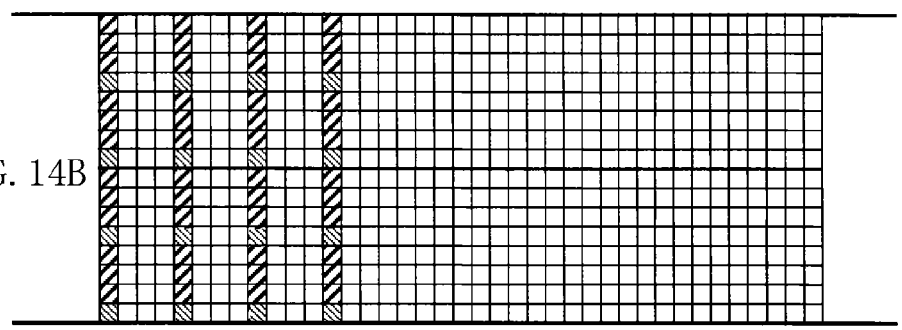
Figure 14C:
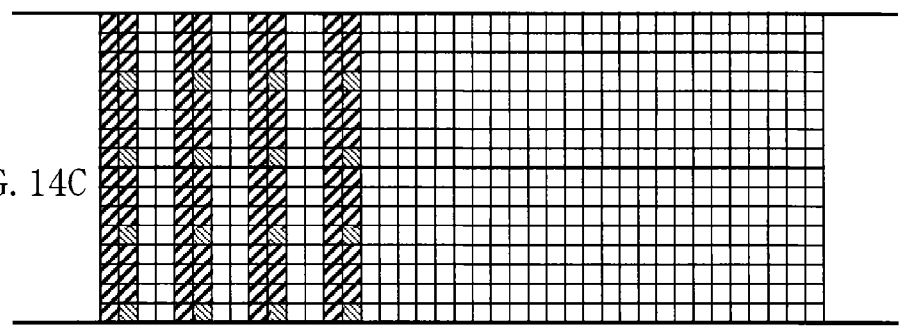

FIGS. 14A to 14C are conceptual diagrams explaining other examples of a writing operation in a stripe according to the first embodiment. FIGS. 14A to 14C show examples in which writing in a stripe is performed using 4×4 multiple beams in the x and y directions. The examples of FIG. 14A to FIG. 14C show the case where there is a distance between beams and a stripe region is divided in the y direction by a width somewhat greater than or equal to the irradiation region of the entire multi beams, for example. Exposure (writing) of one irradiation region by the entire multi beams is completed by shots of sixteen times (one shot is a total of a plurality of irradiation steps) performed while shifting the irradiation position by one mesh in the x direction or the y direction. FIG. 14A shows the mesh region irradiated by the first one-shot (one shot is a total of a plurality of irradiation steps). Next, as shown in FIG. 14B, the second one-shot, the third one-shot, and the fourth one-shot (one shot is a total of a plurality of irradiation steps) are performed while shifting the position by one mesh, one by one, in the y direction to the mesh region having not been irradiated yet. Next, as shown in FIG. 14C, the fifth one-shot (one shot is a total of a plurality of irradiation steps) is performed while shifting the position by one mesh in the x direction to the mesh region having not been irradiated yet. Next, the sixth one-shot, the seventh one-shot, and the eighth one-shot (one shot is a total of a plurality of irradiation steps) are performed while shifting the position by one mesh, one by one, in the y direction to the mesh region having not been irradiated yet.

Figure 15A:
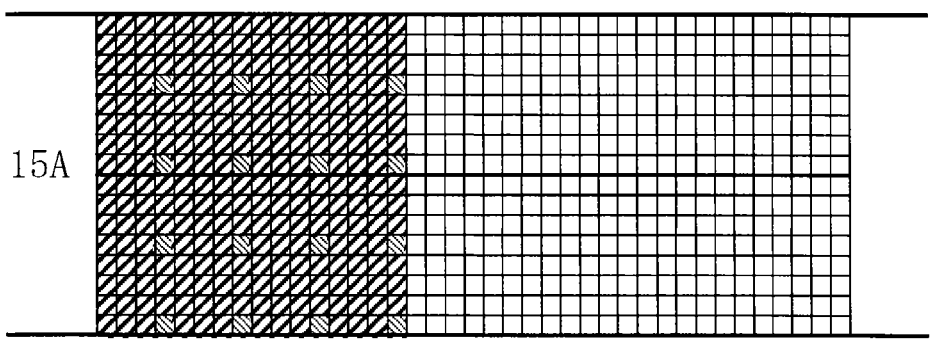
FIGS. 15A to 15C are conceptual diagrams explaining other examples of a writing operation in a stripe according to the first embodiment.
Figure 15B:
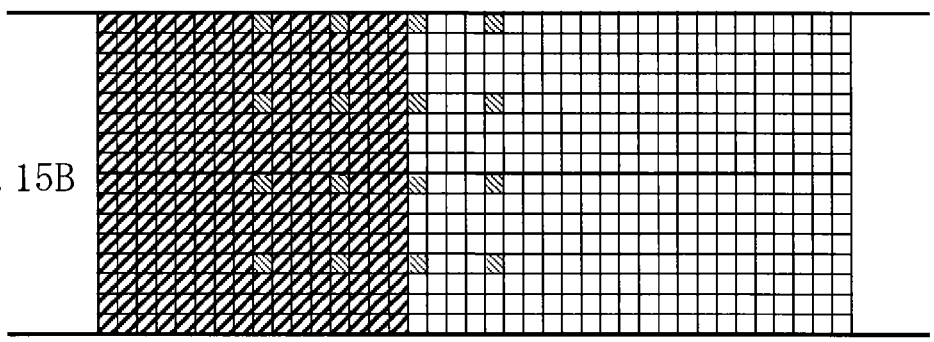
Figure 15C:
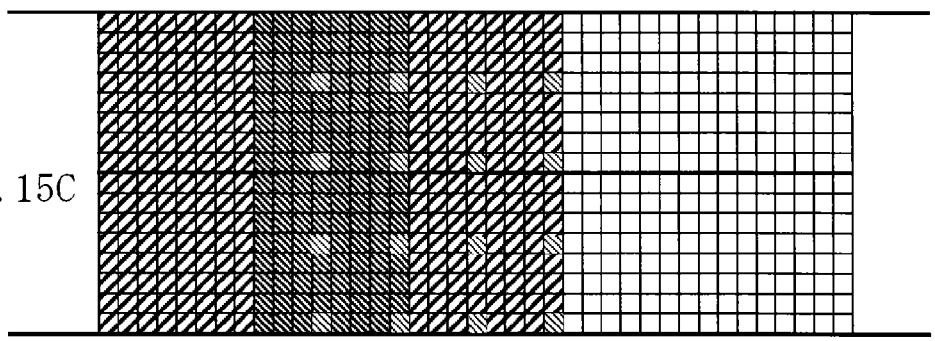

FIGS. 15A to 15C are conceptual diagrams explaining other examples of a writing operation in a stripe according to the first embodiment. FIGS. 15A to 15C are continued from FIG. 14C. As shown in FIG. 15A, the ninth one-shot to the sixteenth one-shot (one shot is a total of a plurality of irradiation steps) are repeatedly performed in order similarly to the operations of FIGS. 13A to 13C. The examples of FIGS. 14A to 14C and 15A to 15C show the case of performing multi-pass writing (multiplicity=2), for example. In such a case, the irradiation position is shifted in the x direction by about half the size of the irradiation region of the entire multi beams, and as shown in FIG. 15B, the first one-shot (one shot is a total of a plurality of irradiation steps) of the second layer of the multi-pass writing is performed. As described referring to FIGS. 14B and 14C, the second one-shot to the eighth one-shot (one shot is a total of a plurality of irradiation steps) of the second layer of the multi-pass writing are performed one by one, hereinafter. As shown in FIG. 15C, the ninth one-shot to the sixteenth one-shot (one shot is a total of a plurality of irradiation steps) are to be repeatedly performed in order similarly to the operations of FIGS. 14B to 14C.

Figure 16:
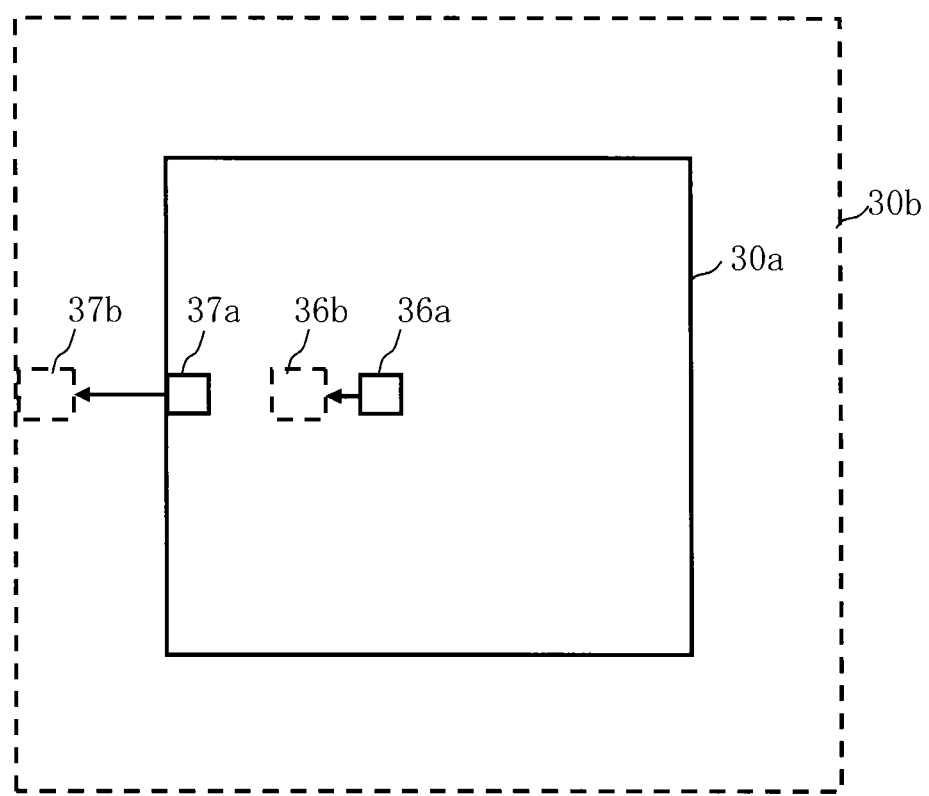
FIG. 16 is a conceptual diagram showing an example of correction of position deviation of multi beams according to the first embodiment.

FIG. 16 is a conceptual diagram showing an example of correction of position deviation of multi beams according to the first embodiment. The image of an irradiation region 30a of the entire multi beams which can be irradiated at a time by the multi beams is enlarged like the image of an irradiation region 30b, for example, due to the space charge effect resulting from change of the amount of current in one shot. Thereby, position deviation occurs such that a beam 36a positioned approximately at the center of the irradiation region 30a shifts to the position denoted by a beam 36b. Moreover, position deviation also occurs such that a beam 37a positioned approximately at the end of the irradiation region 30a shifts to the position denoted by a beam 37b. As shown in FIG. 16, the space charge effect in multi beams gives a larger effect on the beam 37a at the end than on the beam 36a near the center of the irradiation region 30a. Therefore, as having been described in the first embodiment, by dividing one shot into a plurality of times of divided shots, and by correcting, for each divided shot, the elastic rate of an image of the entire multi beams depending upon the number of ON beams of the multi beams, a larger effect can be demonstrated particularly in the beam at the end whose position deviation amount is large.

Thus, in the multi-beam writing, position deviation of a writing pattern caused by the space charge effect can be corrected according to the first embodiment.

Second Embodiment

In the above first embodiment, various phenomena caused by the space charge effect are corrected depending upon the number of ON beams in the entire multi beams, but it is not limited thereto. In the present second embodiment, there will be described a configuration in which various phenomena caused by the space charge effect are corrected by dividing multi beams into a plurality of regions and performing correction depending upon the number of ON beams in each region.

The configuration of the apparatus according to the second embodiment is the same as that of FIGS. 1 to 5. Moreover, the flowchart showing main steps of a writing method according to the second embodiment is the same as that of FIG. 6. The content of the second embodiment is the same as that of the first embodiment, except what is described below.

The content of each step from the pattern area density calculation step (S102) to the irradiation time arrangement data output step (S110) is the same as that of the first embodiment.

In the ON beam number calculation step (S202), the ON beam number calculation unit 74 calculates, for each divided shot, the number of ON beams in multi beams in each region.

Figures 17A, 17B:
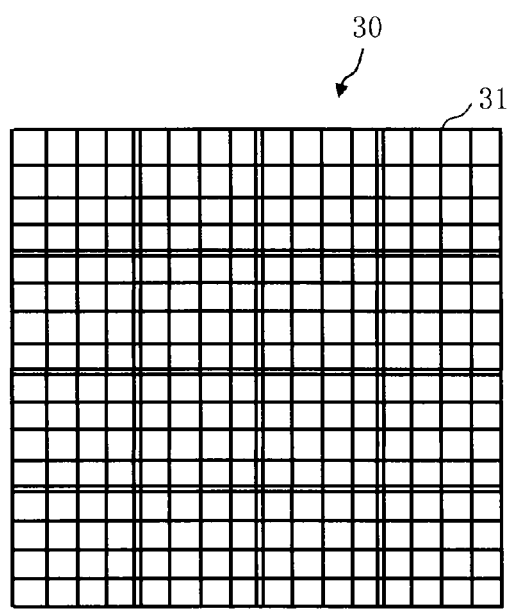
FIGS. 17A and 17B show an example of an ON-beam pattern of multi beams according to a second embodiment.

FIGS. 17A and 17B show an example of an ON-beam pattern of multi beams according to the second embodiment. For example, the number of beams of multi beams that can be irradiated at a time, by using the aperture member 203 wherein m×n (m≥2, n≥2) holes are arranged in m columns in the vertical direction (the y direction) and n rows in the horizontal direction (the x direction), is a number equivalent to m×n (m being the number of columns and n being the number of rows), which in this respect is the same as FIG. 8. In the example of FIG. 17A, the irradiation region 30 of multi beams is divided into a plurality of regions 33, and, for example, it is divided into a plurality of mesh-like regions 33. For example, if the number of beams of multi beams is 512× 512 and the number of the regions 33 is 16, 16384 beams 31 are emitted from each region 33. The number of the regions 33 is not limited thereto, and it is preferable that about 100 or more beams 31 belong to each region 33. Here, as shown in the example of FIG. 17A, the case where it is divided into 16 regions 31 will be described. According to the second embodiment, the number of ON beams is calculated for each region 33. FIG. 17B shows an example of the number of ON beams of each region 33.

In the second embodiment, the number of ON beams is divided into ranks, and a rank pattern is acquired. For example, the ranking is performed, such as the number of beams of the rank A being 0, that of the rank B being 1 to 99, that of the rank C being 100 to 499, that of the rank D being 500 to 999, and that of the rank E being 1000 or more. The number of ranks and the number of beams of each rank are to be suitably set. When the number of beams is 0, since the influence of the space charge effect differs from the case of the number of beams being one or more, it is preferable that an independent rank is prepared. As shown in the example of FIG. 17B, any one of the ranks A to E is set to each region 33. It can be assumed that there are a plurality of rank distribution patterns in the irradiation region 30 of multi beams because any different one of a plurality of ranks may be set for each region 33, for each divided shot. Then, correction is performed for each rank distribution pattern by changing correction values of an elastic rate of an image of the entire multi beams, a focus deviation, and an astigmatism which occur due to the space charge effect. When there is bias in the distribution, such as the case where the current distribution of the entire multi beams is not symmetrical, the center position deviates due to the space charge effect. Therefore, correction is also performed for the center position deviation, for each rank distribution pattern, in the second embodiment.

According to the second embodiment, a correction coefficient of the elastic rate for the reference elastic rate of the image of the entire multi beams is obtained in advance based on an experiment etc. Then, an elastic rate correction table is generated in which correction coefficients of the elastic rate are defined to be corresponding to a rank distribution pattern (an ON beam number pattern). Similarly, a correction coefficient of the focus position for the reference focus position is obtained in advance based on an experiment etc. Then, a focus correction table is generated in which correction coefficients for the focus are defined to be corresponding to a rank distribution pattern (an ON beam number pattern). Similarly, a correction coefficient for deviation of the center position of multi beams is obtained in advance based on an experiment etc. Then, a center position correction table is generated in which correction coefficients for deviation of the center position are defined to be corresponding to a rank distribution pattern (an ON beam number pattern). The elastic rate correction table, the focus correction table, and the center position correction table are stored in the storage device 144. Similarly to the first embodiment, a correction coefficient can be obtained by writing a pattern and measuring the written pattern to obtain a measurement result to calculate the correction coefficient, for example. Moreover, it is also preferable to measure a mark arranged on the stage or perform numerical computation, such as simulation, etc. in order to obtain a correction coefficient.

Elastic rate correction, focus correction, and center position correction are performed as described above. In addition, since astigmatism occurs when the focus position deviates, it is also preferable to obtain an astigmatism correction coefficient corresponding to a rank distribution pattern (an ON beam number pattern), based on an experiment etc. Then, an astigmatism correction table may be generated in which astigmatism correction coefficients are defined to be corresponding to a rank distribution pattern (an ON beam number pattern). The astigmatism correction table may be stored in the storage device 144. Description of astigmatism correction is omitted below.

In the correction coefficient acquisition step (S204), the coefficient acquisition unit 76 refers to the elastic rate correction table stored in the storage device 144 in order to acquire, for each divided shot, an elastic rate correction value (in this case, for example, an elastic rate correction coefficient for the reference elastic rate) for correcting an elastic rate of an image of the entire multi beams in accordance with a rank distribution pattern (an ON beam number pattern). The coefficient acquisition unit 76 is an example of an elastic rate correction value acquisition unit. The coefficient acquisition unit 80 refers to the focus correction table stored in the storage device 144 in order to acquire, for each divided shot, a focus position correction value (in this case, for example, a focus correction coefficient for the reference focus position) for correcting a focus position of the entire multi beams. The coefficient acquisition unit 80 is an example of a focus position correction value acquisition unit. The coefficient acquisition unit 84 refers to the center position correction table stored in the storage device 144 in order to acquire, for each divided shot, a center position correction value (in this case, for example, a center position correction coefficient for the state where no beam center position deviation occurs) for correcting a beam center position of the entire multi beams. The coefficient acquisition unit 84 is an example of a center position correction value acquisition unit.

In the correction coefficient setting step (S206), the coefficient setting unit 78 sets, for each divided shot, an elastic rate correction coefficient in the DAC amplifier 134. Similarly, the coefficient setting unit 82 sets, for each divided shot, a focus correction coefficient in the DAC amplifier 136. One of a pair of voltages is set in the DAC amplifier 134 and the other of the pair is set in the DAC amplifier 136 previously so that the focus position obtained by the objective lens 207 may not change (focus deviation may not occur) in the reference current amount, and an elastic rate of the image of the entire multi beams may be the reference elastic rate which has been pre-set.

Moreover, the coefficient setting unit 86 sets, for each divided shot, an astigmatism correction coefficient in the DAC amplifier 138. Here, it is preferable to make the deflector 208 have a function of correcting a beam center position of multi beams. The deflector 208 is composed of a plurality of electrodes octally divided in the direction of the circumference, for example. Thereby, it is possible to deflect beams in the x and y directions in addition to correcting astigmatism. Although, in FIG. 1, only the DAC amplifier 138 is depicted for the deflector 208, it should be understood that DAC amplifiers are respectively connected to each of the electrodes. In addition, when correcting an astigmatism, what is necessary is to perform astigmatism correction in accordance with the beam center position correction, by the deflector 208.

The content of each step after the target digit data transmission step (S212) is the same as that of the first embodiment. Therefore, in the writing step (S214) based on irradiation time of a target digit, for each beam shot, writing is performed based on the irradiation time of a target digit (for example, the k-th bit (k-th digit)) in irradiation having been divided into a plurality of irradiation steps (divided shots). Moreover, synchronized with a divided shot of the target digit (for example, the k-th bit (the k-th digit)), the electrostatic lens 214 (the first lens) corrects, for each divided shot, the elastic rate of the image of the entire multi beams, depending upon a voltage applied from the DAC amplifier 134, by using an elastic rate correction value. Simultaneously, synchronized with a divided shot of the target digit (for example, the k-th bit (the k-th digit)), the electrostatic lens 216 (the second lens) corrects, for each divided shot, the focus position of the entire multi beams, depending upon the voltage applied from the DAC amplifier 136, by using a focus correction coefficient (an example of a focus position correction value). Moreover, simultaneously, synchronized with a divided shot of the target digit (for example, the k-th bit (the k-th digit)), the deflector 208 corrects, for each divided shot, the beam center position of the entire multi beams, depending upon a voltage applied from the DAC amplifier 138, by using a beam center position correction coefficient (an example of a center position correction value).

In the digit change step (S222), the writing control unit 72 changes a target bit (digit). For example, the target digit is changed to the (k−1)th digit ((k−1)th bit) from the k-th digit (k-th bit). Then, it returns to the target digit data transmission step (S212). Simultaneously, it returns to the correction coefficient acquisition step (S204). Then, with respect to the processing of the (k−1)th digit ((k−1)th bit), the steps from the correction coefficient acquisition step (S204) to the digit change step (S222) are executed. Then, it is similarly repeated until processing of data of all the digits with respect to irradiation time arrangement data has been completed in the determination step (S220).

As described above, since an ON-beam pattern is maintained constant during each divided shot, a rank distribution pattern (ON beam number pattern) is also maintained constant. Therefore, the amount of beam current of each rank distribution pattern is also maintained constant, and the space charge effect during each divided shot is also maintained constant. Therefore, according to the second embodiment, the elastic rate of an image of the entire multi beams is corrected for each divided shot. Simultaneously, a focus deviation is corrected for each divided shot. Simultaneously, the beam center position of the entire multi beams is corrected for each divided shot. Needless to say, astigmatism may be corrected simultaneously. Thereby, it is possible to correct a position deviation caused by the space charge effect in accordance with change of a rank distribution pattern (ON beam number pattern) in one shot. According to the second embodiment, since a rank distribution pattern is used, deviation of a beam center position can also be corrected.

Figure 18:
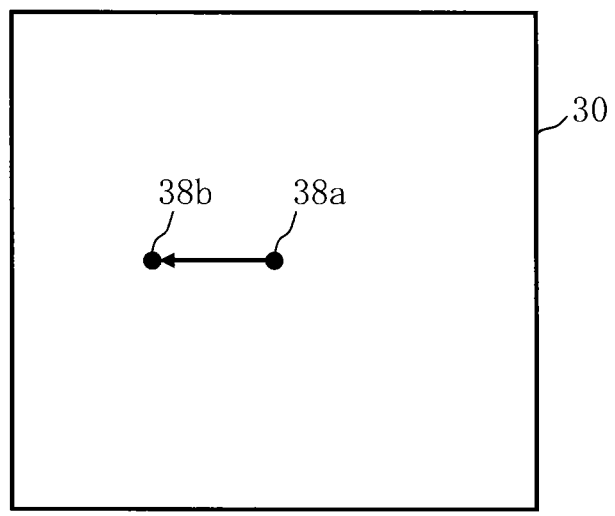
FIG. 18 is a conceptual diagram showing an example of correction of deviation of the beam center position of multi beams according to the second embodiment.

FIG. 18 is a conceptual diagram showing an example of correction of deviation of the beam center position of multi beams according to the second embodiment. A beam center position 38a of the irradiation region 30 of the entire multi beams, which can be beam irradiated at a time by multiple beams, deviates to, for example, a beam center position 38b by the space charge effect in accordance with the change (distribution bias) of the amount of current in one shot. Therefore, according to the second embodiment, one shot is divided into a plurality of times of divided shots, and, for each divided shot, the beam center position of the entire multi beams is corrected according to a rank distribution pattern (ON beam number pattern) of the multi beams, thereby correcting a position deviation caused by the space charge effect even when there is a bias in beam distribution.

According to the second embodiment, as described above, it is possible to correct position deviation of a writing pattern caused by the space charge effect in multi-beam writing.

Third Embodiment

In the first and second embodiments described above, there has been described the case of transmitting data for irradiation steps of n times, 1 bit by 1 bit, in order of the amount of data from the largest, for example, but, it is not limited thereto. In the third embodiment, there will be described the case of transmitting data which has been made by combining data for a plurality of irradiation steps. The apparatus structure according to the third embodiment is the same as that of FIG. 1. The flowchart showing main steps of a writing method according to the third embodiment is the same as that of FIG. 6. The content of the third embodiment is the same as that of the first embodiment or the second embodiment, except what is described below.

The time for data transmission can be included in the irradiation time of an irradiation step by performing, in parallel, transmission of data indicating ON/OFF of the (k−1)th bit ((k−1)th digit) of each beam and the irradiation step of the k-th bit (k-th digit) of each beam. However, since the irradiation time of an irradiation step becomes short if k becomes small, it is difficult to include the transmission of data indicating ON/OFF of the (k−1)th bit ((k−1)th digit) in the irradiation time of the irradiation step. Then, according to the third embodiment, a digit whose irradiation time is long and a digit whose irradiation time is short are grouped. Thereby, the data transmission time of the next group can be included in the sum total of grouped irradiation time in the irradiation step. It is preferable to perform grouping by using a plurality of groups in order that the difference between totals of grouped irradiation time may become shorter. That is, for example, it is preferable to perform grouping, such as to group an n-th digit (n-th bit) and the first digit (first bit), to group the (n−1) digit ((n−1) th bit) and the second digit (second bit), and to group the (n−2) th digit ((n−2) th bit) and the third digit (third bit) and so on.

Figure 19:
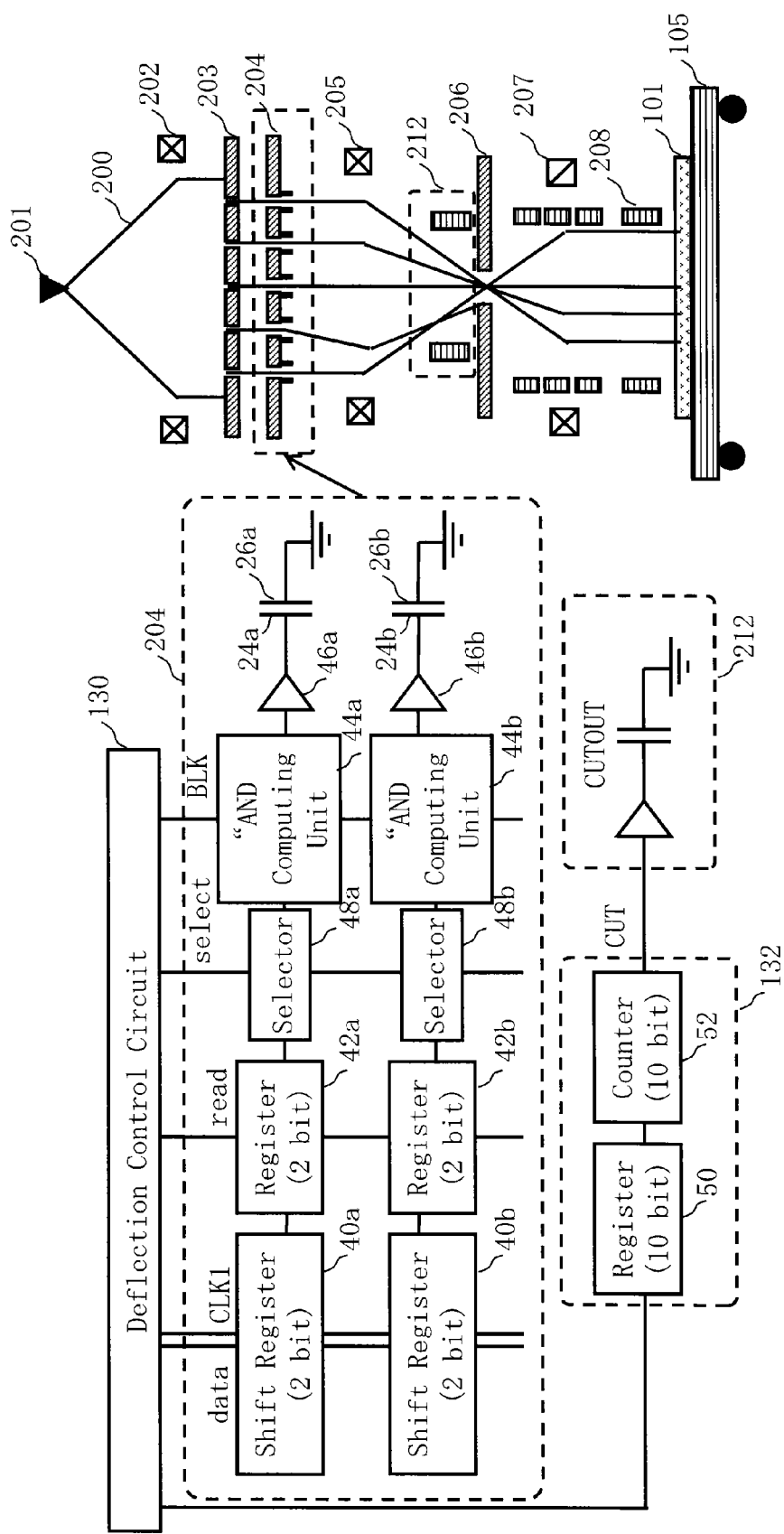
FIG. 19 is a schematic diagram showing an internal structure of an individual blanking control circuit and a common blanking control circuit according to a third embodiment.

FIG. 19 is a schematic diagram showing the internal structure of an individual blanking control circuit and a common blanking control circuit according to the third embodiment. FIG. 19 is the same as FIG. 5 except that a selector 48 is added to each logic circuit 41 for individual blanking control arranged at the blanking plate 204 in the body of the writing apparatus 100, and individual blanking control for each beam is controlled by, for example, a two-bit control signal. Here, the case of combining two irradiation steps to set one group is shown, for example. Therefore, one bit each is used as a control signal, for each irradiation step in the group. Therefore, a two-bit control signal is used for each group. Even if the control signal is two bits, the logic circuit itself of the control circuit for beam ON/OFF can be overwhelmingly small compared with a circuit in which dose control is performed using ten bits. Therefore, the installation area (of a circuit on the blanking aperture) can be made small while improving the response of blanking control (using a common blanking system). In other words, even in the case of arranging a logic circuit on the blanking plate 204 having a narrow installation space, precision of dose control can be improved while realizing a smaller beam pitch.

Figure 20:
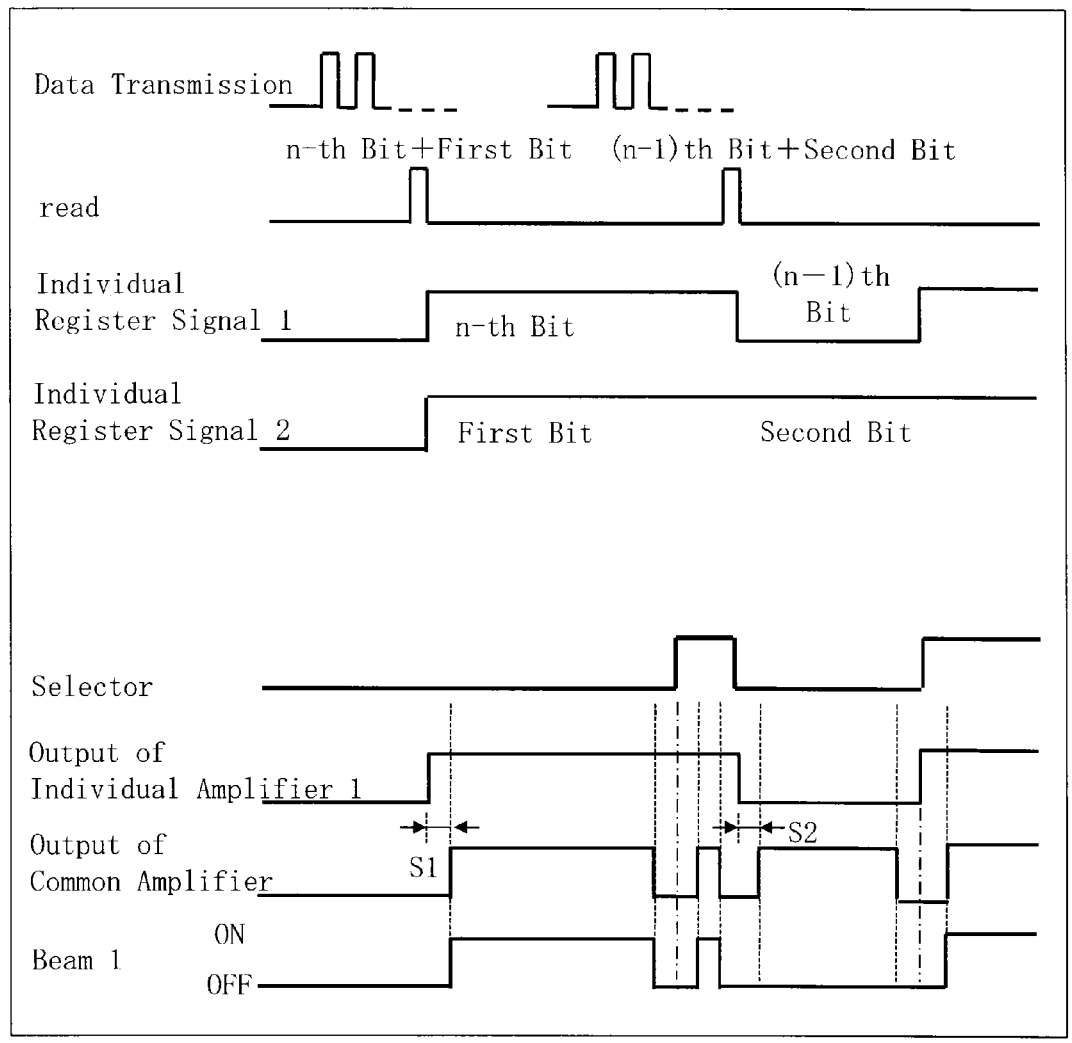
FIG. 20 is a flowchart showing a beam ON/OFF switching operation with respect to a part of an irradiation step of one shot according to the third embodiment.

FIG. 20 is a flowchart showing a beam ON/OFF switching operation with respect to a part of an irradiation step of one shot according to the third embodiment. FIG. 20 shows one beam (the beam 1) as an example in multi beams. Irradiation steps of: from the group of the n-th bit (n-th digit) and the first bit (first digit) to the group of the (n−1)th bit ((n−1)th digit)) and the second bit (second digit) of the beam 1, are shown, for example. As for irradiation time arrangement data, there is shown the case of the n-th bit (n-th digit) being "1", the first bit (first digit) being "1", the (n−1)th bit ((n−1)th digit) being "0", and the second bit (second digit) being "1", for example.

First, in response to the input of a read signal of the group of the n-th bit (n-th digit) and the first bit (first digit), the individual register 42 (an individual register signal 1 (the n-th digit) and an individual register signal 2 (the first digit)) outputs ON/OFF signals in parallel (as parallel transmission signals), based on the stored data of the n-th bit (n-th digit) and the first bit (first digit). Since a two-bit signal is used in the third embodiment, it is necessary to select and switch a signal.

Referring to FIG. 20, first, data of the individual register signal 1 is selected by the selector 48, and an ON signal of the n-th bit (the n-th digit) is output to the individual amplifier. Next, with respect to the output of the individual register 42, data of the individual register 2 is selected by the switching of the selector 48, and the output of the n-th bit (the n-th digit) is switched to the output of the first bit (the first digit). This switching is sequentially repeated for each irradiation step.

Since the data of the n-th bit (the n-th digit) is data indicating ON, the individual amplifier 46 (the individual amplifier 1) outputs an ON voltage to be applied to the blanking electrode 24 for the beam 1. On the other hand, in the logic circuit 132 for common blanking, ON/OFF is switched depending upon the timing data of ten bits of each irradiation step. In the common blanking system, an ON signal is output during the irradiation time of each irradiation step. For example, if Δ=1 ns, the irradiation time of the first irradiation step (for example, the tenth digit (the tenth bit)) is Δ×512=512 ns. The irradiation time of the second irradiation step (for example, the first digit (the first bit)) is Δ×1=1 ns. The irradiation time of the third irradiation step (for example, the ninth digit (the ninth bit)) is Δ×256=256 ns. The irradiation time of the fourth irradiation step (for example, the second digit (the second bit)) is Δ×2=2 ns. Similarly, it is ON during the irradiation time of each digit (each bit) of each group, hereafter. In the logic circuit 132, when the timing data of each irradiation step is input into the register 50, the register 50 outputs the data indicating ON of the k-th digit (the k-th bit), the counter 52 counts the irradiation time of the k-th digit (the k-th bit), and it is controlled to be OFF after the irradiation time has passed. Hereafter, beam irradiation is hereafter performed in order for each group.

As described above, according to the third embodiment, data transmission time can be included in the total grouped irradiation time in the irradiation step.

Although, in the third embodiment, the case of using the transmission channel where a two bit parallel shift register is used is described, it is also acceptable to use one bit serial transmission as long as a sufficient transmission rate can be obtained. The design of the transmission channel may be suitably selected by an engineer concerned. Moreover, although it has the structure in which two data is switched by the selector, it is also effective to perform transmission in order by using a shift register without using a selector.

Furthermore, although the configuration of the case of grouping two irradiation steps has been described as the third embodiment, it is not limited thereto. For example, if three irradiation steps are grouped, the total time of a data transmission time and a grouped irradiation time in an irradiation step can be more uniformized. If the number of grouped irradiation steps is increased, uniformity can be enhanced. For example, when the irradiation step is each digit of a binary number, if the number of irradiation steps to be grouped is three or four, a sufficient uniformity result can be acquired. However, when the number of irradiation steps is increased, the number of necessary registers is also increased, which results in increasing the circuit area. Therefore, the number of irradiation steps to be grouped is to be suitably selected according to a demand.

A concrete embodiment is not limited to what is described above. Various embodiments can be selected based on the gist of the present invention that the transmission time of group data is to be included in the total grouped irradiation time in the irradiation step.

Fourth Embodiment

Although, in each embodiment described above, blanking control is performed for a plurality of times of divided shots obtained by dividing one shot, for each beam, by using the blanking plate 204 for individual blanking control and the deflector 212 for common blanking, it is not limited thereto. In the fourth embodiment, there will be described a configuration in which blanking control is performed for a plurality of times of divided shots obtained by dividing one shot, for each beam, by using the blanking plate 204 for individual blanking control without using the deflector 212 for common blanking.

Figure 21:
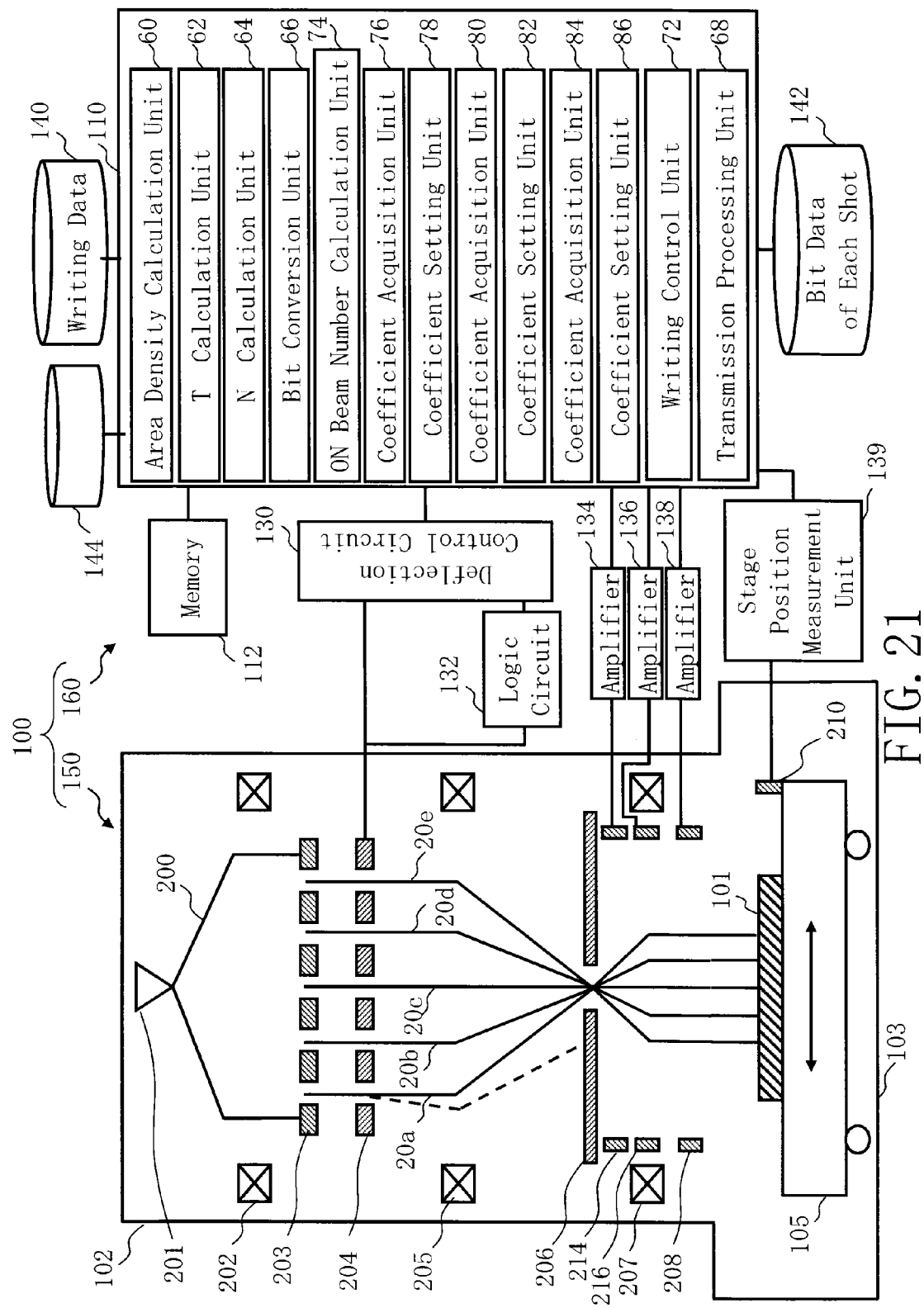
FIG. 21 is a schematic diagram showing the structure of a writing apparatus according to a fourth embodiment.

FIG. 21 is a schematic diagram showing the structure of a writing apparatus according to the fourth embodiment. FIG. 21 is the same as FIG. 1 except that the deflector 212 does not exist and output of the logic circuit 132 is connected to the blanking plate 204. Main steps of a writing method according to the fourth embodiment are the same as those of FIG. 6. The content of the fourth embodiment is the same as that of any one of the first to third embodiments, except what is described below.

Figure 22:
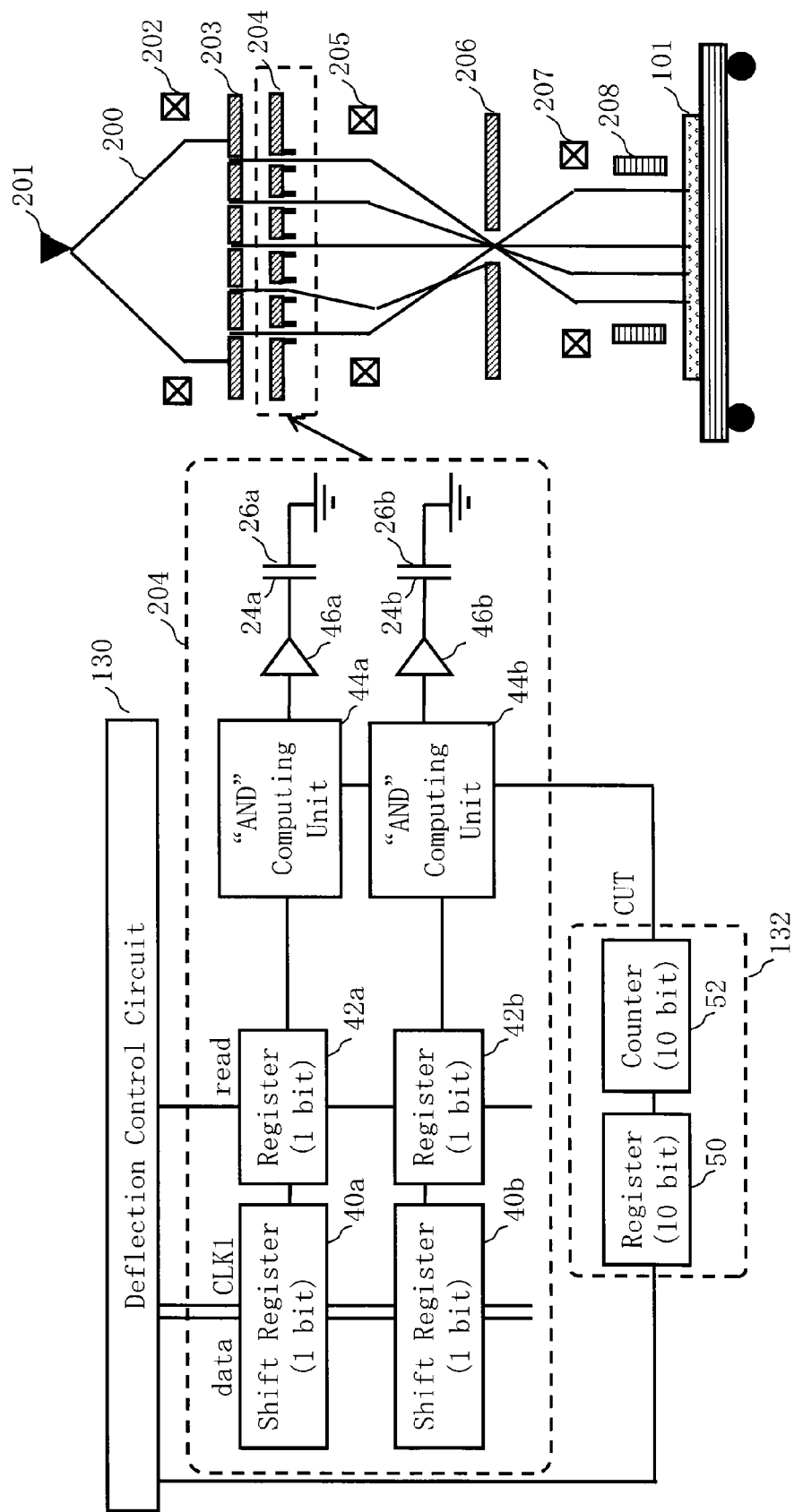
FIG. 22 is a schematic diagram showing the internal structure of an individual blanking control circuit and a common blanking control circuit according to the fourth embodiment.

FIG. 22 is a schematic diagram showing the internal structure of an individual blanking control circuit and a common blanking control circuit according to the fourth embodiment. The content of FIG. 22 is the same as that of FIG. 5, except that the deflector 212 does not exist and an output signal of the logic circuit 132 is input into the AND computing unit 44 (AND circuit) instead of a signal from the deflection control circuit 130.

In the individual beam ON/OFF switching step (S116), an ON/OFF control signal (first ON/OFF control signal) for a beam is output by the logic circuit (first logic circuit) of the beam concerned, for each beam, with respect to each time irradiation of irradiation of a plurality of times, by using a plurality of logic circuits (first logic circuit) each including the shift register 40 and the individual register 42 each respectively outputting a beam ON/OFF control signal to a corresponding beam in multi beams. Specifically, as described above, when inputting data of the k-th bit (the k-th digit), the individual register 42 of each beam outputs an ON/OFF signal to the AND computing unit 44 based on the input data. If the data of the k-th bit (the k-th digit) is "1", an ON signal is to be output, and if it is "0", an OFF signal is to be output.

In the entire beams ON/OFF switching step (S118), for each beam, with respect to each time irradiation of irradiation of a plurality of times, after a beam ON/OFF control signal has been switched by the logic circuit for individual blanking, a beam ON/OFF control signal (second ON/OFF control signal) is output so that a beam may be in the ON state during the irradiation time corresponding to the irradiation concerned, by using the logic circuit 132 (second logic circuit) which collectively outputs a beam ON/OFF control signal to the entire multi beams. Specifically, in the logic circuit 132 for common blanking, ON/OFF is switched depending upon 10-bit timing data of each irradiation step. The logic circuit 132 outputs an ON/OFF control signal to the AND computing unit 44. In the logic circuit 132, an ON signal is output during the irradiation time of each irradiation step.

In the blanking control step, the AND computing unit 44 performs blanking control so that a beam concerned may be in the ON state during the irradiation time corresponding to the irradiation concerned, when both the ON/OFF control signal for an individual beam and the ON/OFF control signal for entire beams are ON control signals. When both the ON/OFF control signal for an individual beam and the ON/OFF control signal for entire beams are ON control signals, the AND computing units 44 outputs an ON signal to the amplifier 46, and, then, the amplifier 46 applies an ON voltage to the electrode 24 of the individual blanking deflector. In other case, the AND computing unit 44 outputs an OFF signal to the amplifier 46, and, then, the amplifier 46 applies an OFF voltage to the electrode 24 of the individual blanking deflector. Thus, when both the ON/OFF control signal for an individual beam and the ON/OFF control signal for entire beams are ON control signals, the electrode 24 (individual blanking system) of the individual blanking deflector individually performs beam ON/OFF control so that the beam concerned may be in the ON state during the irradiation time corresponding to the irradiation concerned.

Since the individual blanking circuit is arranged in the large region of the blanking plate, time deviation is generated in operations of the individual blanking circuit because of delay by the circuit or delay by the length of wiring. However, if a beam-on signal is supplied from the common blanking when the operation of the individual blanking circuit affected by the response speed gap has been settled, it is possible to avoid unstable beam irradiation caused by delay and the like of the individual circuit.

As described above, even when the blanking plate 204 for individual blanking control is used without using the deflector 212 for common blanking, the restriction on a circuit installation space can be maintained like the first embodiment. Moreover, since the logic circuit 41 for individual blanking has a data amount of one bit, power consumption can also be suppressed. Furthermore, there is an advantage that the deflector 212 for common blanking can be omitted.

According to the present embodiment, the logic circuit 132 for common blanking may be manufactured independently, or, alternatively, it can also be manufactured, as an integrated circuit of a monolithic structure, by being arranged at the peripheral part of the blanking plate. If the logic circuit 132 for common blanking is arranged at the peripheral part of the blanking plate, the wiring length to the individual blanking circuit can be made short, which has an advantage of facilitating an exact timing control.

Although, in the example described above, the case of the logic circuit 41 for individual blanking having a data amount of one bit is described, it is not limited thereto. The structure according to the fourth embodiment can also be applied to the case of a data amount of two bits like the third embodiment. Moreover, the structure of the fourth embodiment is applicable to other embodiments.

Fifth Embodiment

Although, in each embodiment described above, the case where each divided irradiation step corresponds to each digit of a binary number is described, the way of dividing is not limited thereto. Except for the dividing way to be corresponding to each digit of a binary number, divided irradiation steps can be depending upon a combination of various different time periods or same time periods. In the fifth embodiment, there will be described the case where irradiation step division is based on a combination of various different time periods or same time periods. The apparatus structure is the same as that of FIG. 1 or FIG. 21.

The content of the present embodiment is the same as that of any one of embodiments described above, except what is described below.

The combination of divided irradiation time (X0Δ, X1Δ, X2Δ, ..., X(m−1)Δ) that can express an arbitrary irradiation time, which is up to the maximum irradiation time Tmax, can be selected according to the conditions described below. (Hereinafter, the divided irradiation time (X0Δ, X1Δ, X2Δ, ..., X(m−1)Δ) will just be described as a combinatorial sequence (X0, X1, X2, ..., X(m−1)) where Δ is omitted.)

First, combining can be performed based on definition of a divided irradiation time of the first digit (k=0) as XΔ=1 and a divided irradiation time of the k-th digit as Xk≤{Σ(Xi)}+1, (i=0 to (k−1)). Xk shall be an integer of 1 or more. Here, {Σ(Xi)} (i=0 to (k−1)) means (X0+X1+ ... +X(k−2)+X(k−1)) that is an added value of parenthesized Xi from X0 to X(k−1). Hereinafter, it will be explained using the same expression.

In the conditions described above, for example, since X0=1, X1 is either 1 or 2. When X1=2, X2 is one of 1 to 4. Here, in the case of X2 is 3, with respect to a combinatorial sequence (X0, X2, X3)=(1, 2, 3), arbitrary time setting from 0 to 6 can be performed depending upon which digit is selected (added or not added).

Considering the case of Xk, with respect to the combinatorial sequence (X0, ... X(k−1)) of from X0 to X(k−1), arbitrary time setting from 0 to Δ·{Σ(Xi)} (i=0 to (k−1)) can be performed. Then, with respect to another combinatorial sequence (X0, ..., X(k−1), Xk) in which Xk is added, arbitrary irradiation time setting from 0 to {Σ(Xi)} (i=0 to (k−1)) can be performed when Xk is not selected, and arbitrary irradiation time setting from Xk to Xk+{Σ(Xi)} (i=0 to (k−1)) can be performed when Xk is selected.

With respect to a settable region in the case of selecting Xk or not selecting Xk, if the maximum value +1 in not selecting Xk is defined as the minimum value in selecting Xk (that is, $Xk=\{\Sigma(Xi)\}+1$ (i=0 to (k−1)), the settable region becomes a setting region having a continuous value of combined Xk. Therefore, as a divided time combination of a combinatorial sequence (X0, . . . , X(k−1), Xk), it is possible to arbitrarily set time from 0 to $Xk+\{\Sigma(Xi)\}$ (i=0 to (k−1)), that is from 0 to $\{\Sigma(Xi)\}$ (i=0 to k).

Moreover, if defining $Xk<\{\Sigma(Xi)\}+1$ (i=0 to (k−1)), though the settable range in the case of selecting Xk or not selecting Xk overlap with each other (that is, there is an irradiation time which can be set in both the case of selecting Xk and not selecting Xk), it is acceptable to perform such selection.

Furthermore, if increasing the number of terms (digits) of Xk to m terms (digits) so that the maximum irradiation time Tmax may be $Tmax \leq \Delta \cdot \{\Sigma(Xi)\}$ (i=0 to (m−1)), namely so that it may be set up to the maximum irradiation time Tmax, the combinatorial sequence (X0, X1, X2, . . . , Xm−1) becomes a combination of divided time obtained by arbitrarily setting time of from 0 to Tmax.

Here, the irradiation time T of each shot is expressed by the combination of Xi to be $T=\Delta \cdot \{\Sigma(ai \cdot Xi)\}$ (i=0 to (m−1)).

Here, ai is expressed by 1 or 0 corresponding to the case of selecting or not-selecting. Therefore, if pseudoly expressing the sequence of ai (a0, a1, a2, a3, . . . , a(m−1)) by 0 or 1 like a binary number, it is convenient in processing.

Particularly, if defining $Xk=\{\Sigma(Xi)\}+1$ (i=0 to (k−1)), Xk ($Xk=2^k$) expressing each digit of a binary number satisfies the conditions described above, and m being the number of necessary digits can be expressed by the minimum number.

Another example satisfying the conditions described above is explained below. As an example of combining irradiation steps of the same time period, when N=700 in the case of Δ=1 ns, it is possible to perform irradiation by combining the irradiation steps of 256 ns (beam ON), 256 ns (beam ON), 256 ns (beam OFF), 64 ns (beam ON), 64 ns (beam ON), 64 ns (beam OFF), 16 ns (beam ON), 16 ns (beam ON), 16 ns (beam ON), 4 ns (beam ON), 4 ns (beam ON), 4 ns (beam ON), 1 ns (beam OFF), 1 ns (beam OFF) and 1 ns (beam OFF). In that case, irradiation is performed by irradiation steps of fifteen times. This dividing way of irradiation steps, compared with the case where each irradiation step is corresponding to each digit of a binary number, has a possibility of a throughput decrease because the number of irradiation steps increases. However, at the same time, it has an advantage that control circuit design can be easily performed because of the repletion of the same time period. Thus, although the dividing way of the irradiation step according to each digit of a binary number has an advantage that the number of irradiation steps becomes the minimum, various combination other than what is described above can be performed. The combination type should be selected according to a demand.

In the divided shot data generation step (S108), using a sequence of a predetermined number of terms in which each value is less than or equal to a value obtained by adding 1 to the sum of previous values up to a value just before the each value concerned, the bit conversion unit 66 respectively generates, for each shot, irradiation time arrangement data so that the total of values obtained by selecting or not selecting a value of each term of the sequence may become the irradiation time (in this case, a gray level value N) of each beam of electron multi beams. The irradiation time arrangement data is identified, for example, by "1" when selected and by "0" when not selected. For example, using the above combinatorial sequence (1, 1, 1, 4, 4, 4, 16, 16, 16, 64, 64, 64, 256, 256, 256) of the fifteen terms, in the case of defining N=700 by Δ=1 ns, it becomes: 1 (non-selected=0), 1 (non-selected=0), 1 (non-selected=0), 4 (selected=1), 4 (selected=1), 4 (selected=1), 16 (selected=1), 16 (selected=1), 16 (selected=1), 64 (non-selected=0), 64 (selected=1), 64 (selected=1), 256 (non-selected=0), 256 (selected=1), and 256 (selected=1). For example, when performing irradiation sequentially from the larger (longer) value (irradiation time), the irradiation time arrangement data of N=700 can be defined as "110110111111000". Although, values are arranged, in this case, from the larger to the smaller as an example, it is also preferable to define from the smaller to the larger, in accordance with the original order of the sequence, as "000111111011011". It should be understood that the irradiation time indicated by each digit (term) of the irradiation time arrangement data is related with the value of each term of the pre-set sequence.

As described above, each shot is not restricted to the value of each digit of a binary number, and may be divided into a plurality of irradiation steps by combination of irradiation time of other sequence values.

In the writing step (S214) based on irradiation time of a target digit, for each beam shot, writing is performed based on the irradiation time of a target digit (for example, the k-th bit (k-th digit)) in the irradiation divided into a plurality of irradiation steps. Thus, for each beam shot, irradiation of a beam concerned is divided into irradiation performed the number of times equal to the number of terms of a sequence, wherein the sequence is equivalent to a combination of irradiations of the irradiation time periods of the terms each indicating an irradiation time period of a corresponding value of the sequence, and based on the irradiation time arrangement data, irradiation is performed onto the target object by, in order, irradiating a beam of the irradiation time period corresponding to the value of each selected term.

Moreover, as described in the third embodiment, it is also preferable to have a structure in which data for a plurality of irradiation steps are combined to be transmitted. In other words, as to irradiation performed the number of times equal to the number of sequence digits, it is preferable to set a plurality of groups composed of a plurality of values each being a value of each digit of a sequence, and then, beam irradiation is performed for each group in order. Thereby, the data transmission time of the next group can be included in the total of grouped irradiation time in an irradiation step. Like the third embodiment, it is preferable to set a plurality of groups so that the difference between the totals of grouped irradiation time may be more uniform. For example, it is preferable to perform grouping, such as a group of the n-th digit (n-th bit) and the first digit (first bit), a group of the (n−1)th digit ((n−1)th bit) and the second digit (second bit), a group of the (n−2)th digit ((n−2)th bit) and the third digit (third bit) . . . and so on.

The embodiments have been explained referring to concrete examples described above. However, the present invention is not limited to these specific examples.

Moreover, while the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a divided shot data generation unit configured to generate, for each shot of multi beams of charged particle beams, data for a plurality of times of divided shots such that irradiation for one shot of each beam is divided into the plurality of times of divided shots each having a different irradiation time;
   an individual blanking system configured to provide blanking control individually for the each beam of the multi beams, based on the data for the plurality of times of divided shots;
   an elastic rate correction value acquisition unit configured to acquire, for each divided shot of the plurality of times of divided shots, a correction value for correcting a position deviation of a writing pattern, depending upon a number of ON beams of the multi beams; and
   a lens configured to correct, for the each divided shot, the position deviation of the writing pattern by using the correction value.

2. The apparatus according to claim 1 further comprising:
   a center position correction value acquisition unit configured to acquire, for the each divided shot, a center position correction value for correcting a beam center position of the whole of the multi beams; and
   a deflector configured to correct, for the each divided shot, the beam center position of the whole of the multi beams by using the center position correction value.

3. The apparatus according to claim 1 further comprising:
   a focus position correction value acquisition unit configured to acquire, for the each divided shot, a focus position correction value for correcting a focus position of the whole of the multi beams; and
   a second lens configured to correct, for the each divided shot, the focus position of the whole of the multi beams by using the focus position correction value.

4. The apparatus according to claim 1 further comprising:
   a common blanking system configured to perform, for the each divided shot, beam ON/OFF control collectively for the whole of the multi beams, in addition to beam ON/OFF switching performed for the each beam by the individual blanking system.

5. The apparatus according to claim 1 further comprising:
   an irradiation time calculation unit configured to calculate, for each mesh region of a predetermined size, an irradiation time per shot of the each beam of the multi beams.

6. The apparatus according to claim 5 further comprising:
   a gray level value calculation unit configured to calculate a gray level value of an integer used in defining the irradiation time for the each mesh region by using a predetermined quantization unit.

7. The apparatus according to claim 6, wherein the divided shot data generation unit converts the gray level value into n binary numbers previously set, where the n is a number of digits.

8. The apparatus according to claim 7, wherein the divided shot data generation unit divides the irradiation of the one shot of the each beam into n divided shots, where the n is the number of digits.

9. The apparatus according to claim 8, wherein, as irradiation time of the plurality of times of divided shots, an irradiation time equivalent to what is obtained by defining each value of the n binary numbers in decimal notation is used, where the n is the number of digits.

10. A multi charged particle beam writing method comprising:
    dividing, for each shot of multi beams of charged particle beams, irradiation for one shot of each beam of the multi beams into a plurality of times of divided shots each having a different irradiation time, and irradiating, in order, a beam of an irradiation time corresponding to each of the plurality of times of divided shots onto a target object; and
    correcting, for the each of the plurality of times of divided shots, a position deviation of a writing pattern, depending upon a number of ON beams of the multi beams.

11. A multi charged particle beam writing apparatus comprising:
    a divided shot data generation means for generating, for each shot of multi beams of charged particle beams, data for a plurality of times of divided shots such that irradiation for one shot of each beam is divided into the plurality of times of divided shots each having a different irradiation time;
    an individual blanking means for providing blanking control individually for the each beam of the multi beams, based on the data for the plurality of times of divided shots;
    an elastic rate correction value acquisition means for acquiring, for each divided shot of the plurality of times of divided shots, a correction value for correcting a position deviation of a writing pattern, depending upon a number of ON beams of the multi beams; and
    a lens for correcting, for the each divided shot, the position deviation of the writing pattern by using the correction value.

* * * * *